US011145734B1

(12) United States Patent
Yu et al.

(10) Patent No.: US 11,145,734 B1
(45) Date of Patent: Oct. 12, 2021

(54) SEMICONDUCTOR DEVICE WITH DUMMY FIN AND LINER AND METHOD OF FORMING THE SAME

(71) Applicant: Taiwan Semiconductor Manufacturing Co., Ltd., Hsin-Chu (TW)

(72) Inventors: Jia-Ni Yu, Hsinchu (TW); Kuo-Cheng Chiang, Hsinchu County (TW); Lung-Kun Chu, New Taipei (TW); Mao-Lin Huang, Hsinchu (TW); Chung-Wei Hsu, Hsinchu (TW); Chih-Hao Wang, Hsinchu County (TW); Kuan-Lun Cheng, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/915,784

(22) Filed: Jun. 29, 2020

(51) Int. Cl.

| | |
|---|---|
| ***H01L 29/423*** | (2006.01) |
| ***H01L 29/66*** | (2006.01) |
| ***H01L 29/06*** | (2006.01) |
| ***H01L 29/786*** | (2006.01) |
| ***H01L 21/02*** | (2006.01) |

(52) U.S. Cl.
CPC .. *H01L 29/42392* (2013.01); *H01L 21/02532* (2013.01); *H01L 21/02603* (2013.01); *H01L 29/0649* (2013.01); *H01L 29/0673* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ......... H01L 21/02518; H01L 21/02532; H01L 21/0259; H01L 21/02603; H01L 21/8232; H01L 21/8234; H01L 21/823431; H01L 21/823821; H01L 27/085; H01L 27/0886; H01L 27/0924; H01L 29/0649; H01L 29/0665; H01L 29/0669; H01L 29/0673; H01L 29/4232; H01L 29/42384; H01L 29/42392; H01L 29/66477; H01L 29/66545; H01L 29/66553; H01L 29/66742; H01L 29/66795; H01L 29/78; H01L 29/785; H01L 29/78618; H01L 29/78696
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |

(Continued)

*Primary Examiner* — Cheung Lee
(74) *Attorney, Agent, or Firm* — Haynes and Boone, LLP

(57) ABSTRACT

Semiconductor device and the manufacturing method thereof are disclosed. An exemplary semiconductor device comprises semiconductor layers over a substrate, wherein the semiconductor layers are separated from each other and are stacked up along a direction substantially perpendicular to a top surface of the substrate; a gate structure wrapping each of the semiconductor layers; a spacer structure wrapping an edge portion of each of the semiconductor layers; and a dummy fin structure contacting a sidewall of the gate structure, wherein the dummy fin structure is separated from a sidewall of the spacer structure by a dielectric liner.

20 Claims, 32 Drawing Sheets

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 10,797,163 B1 * | 10/2020 | Yu | H01L 29/66439 |

* cited by examiner

SEMICONDUCTOR DEVICE WITH DUMMY FIN AND LINER AND METHOD OF FORMING THE SAME

BACKGROUND

Multi-gate devices have been introduced to improve gate control by increasing gate-channel coupling and reducing off-state current. One such multi-gate device is a nanosheet device. A nanosheet device generally refers to any device having a channel region including separated channel semiconductor layers, and a gate structure, or portions thereof, formed on more than one side of the channel region (for example, surrounding a portion of the channel region). In some instances, a nanosheet device is also called as a nanowire device, a nanoring device, a gate-surrounding device, a gate-all-around (GAA) device, or a multi-channel bridge device. Nanosheet transistors are compatible with conventional complementary metal-oxide-semiconductor (CMOS) fabrication processes and allow aggressive scaling down of transistors.

However, aggressive scaling down of integrated circuit (IC) dimensions has introduced increased complexity to the semiconductor manufacturing process and resulted in some issues of the semiconductor device. For example, the aggressive scaling down of IC dimensions, i.e. smaller pitches and critical dimensions, has resulted in difficulties to meet the density demand of some fabrication processes, such as a metal gate etching process. In other words, the patterning window is constrained by the limited distance between the adjacent metal gate structures. Therefore, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-20A illustrate cross-sectional views of the example semiconductor device along plane A-A' of the example semiconductor device at intermediate stages of the method of FIG. 1 in accordance with some embodiments of the present disclosure.

FIGS. 3B-20B illustrate cross-sectional views of the semiconductor device along plane B-B' of the example semiconductor device at intermediate stages of the method of FIG. 1 in accordance with some embodiments of the present disclosure.

FIGS. 10C-20C illustrate cross-sectional views of the semiconductor device along plane C-C' of the example semiconductor device at intermediate stages of the method of FIG. 1 in accordance with some embodiments of the present disclosure.

FIGS. 10D-20D illustrate cross-sectional views of the semiconductor device along plane D-D' of the example semiconductor device at intermediate stages of the method of FIG. 1 in accordance with some embodiments of the present disclosure.

DETAILED DESCRIPTION

Figure 1:
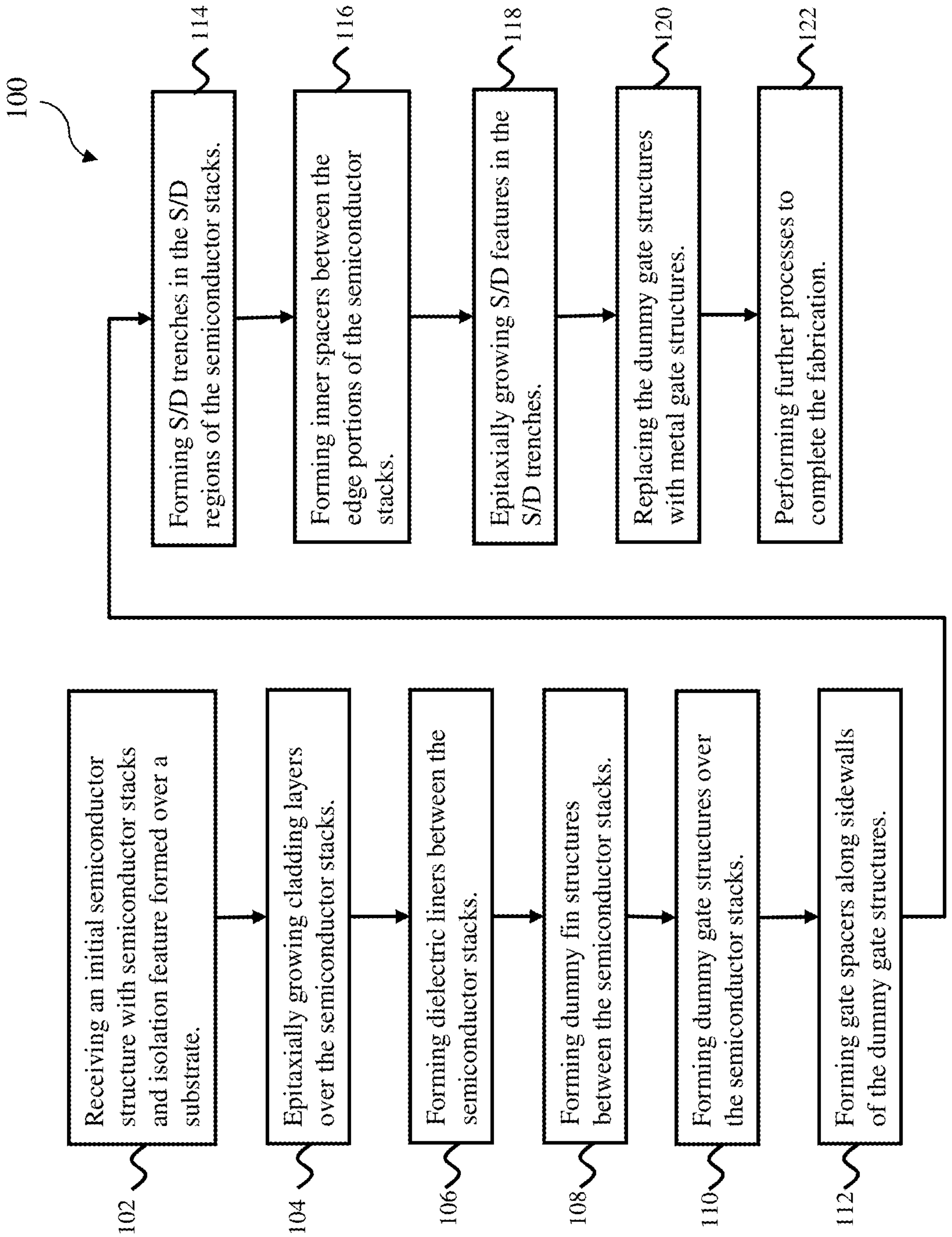
FIG. 1 illustrates a flowchart of an example method for making an example integrate circuit (IC) in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as nanosheet FETs (nanosheet FETs).

In a nanosheet device, a channel region of a single device may comprise multiple layers of semiconductor material physically separated from one another. In some examples, a gate of the device is disposed above, alongside, and even between the semiconductor layers of the device. However, with the scaling down of IC dimensions, smaller pitches and critical dimensions (especially between the conductive features) has resulted in complexity in IC fabrication. For example, during the metal gate etching process, overlay shifting may occur during the patterning which may cause the damage to the metal gate structures and degrade the performance of the semiconductor device. In addition, in a case that a dummy fin structure (also referred to as a dielectric fin structure) is used to patterning the metal gate, the patterning window is more constrained by the additional dielectric fin along the end-cap (i.e. the distance between the active region and the dielectric fin) direction.

The present disclosure is generally related to formation of nanosheet devices, wherein a dummy fin structure is formed between the adjacent gate structures, and a thin dielectric liner is formed between the dummy fin structure and the gate structures. The thin dielectric liner can enlarge the distance between the metal gate and the dummy fin structure (i.e. the end-cap size), thereby can relax the metal gate patterning window and mitigate the overlay shifting issue of the metal gate patterning. Therefore, the performance of the semiconductor device can be improved. Of course, these advantages are merely examples, and do not limit the disclosed embodiments.

Figure 2:
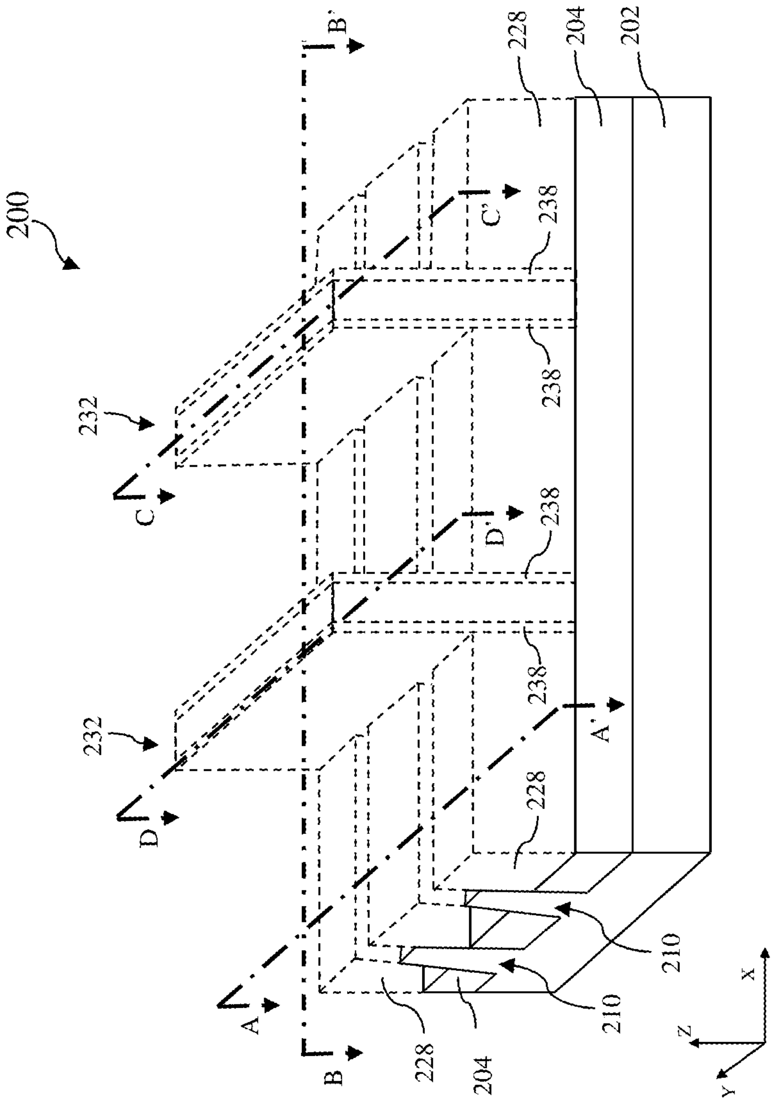
FIG. 2 illustrates a three-dimensional perspective view of one example semiconductor device at intermediate stages of the method of FIG. 1 in accordance with some embodiments of the present disclosure.
Figure 21:
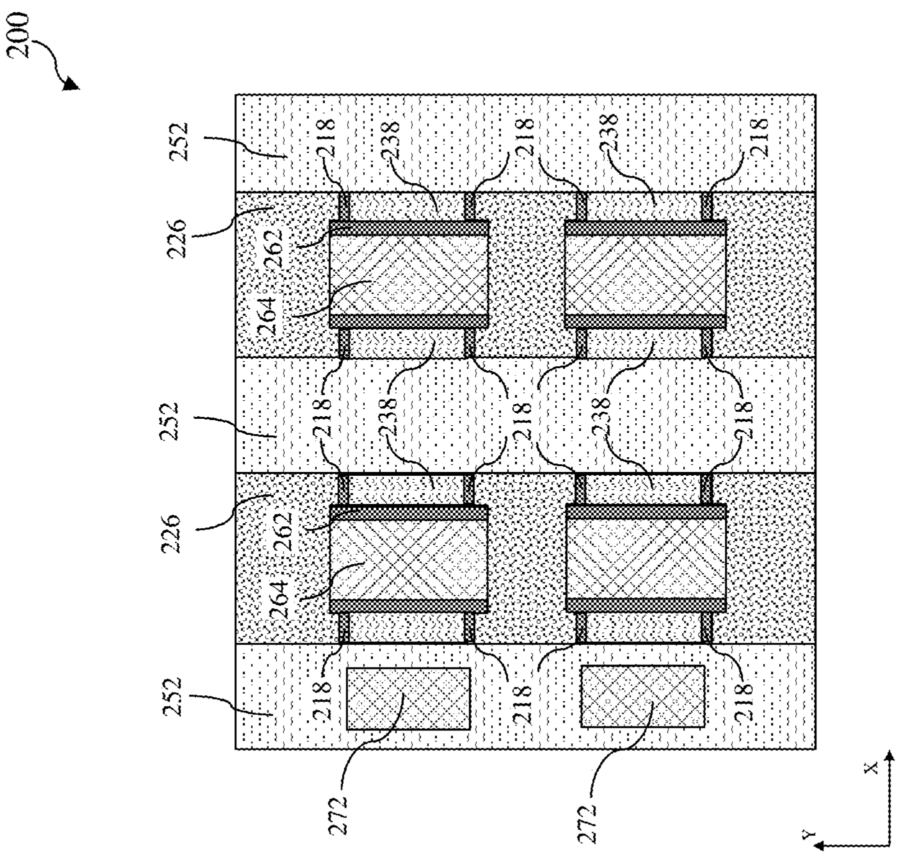
FIG. 21 illustrate a top view of the semiconductor device along plane E-E' shown in FIGS. 20A-20D in accordance with some embodiments of the present disclosure.

FIG. 1 illustrates a flow chart of a method 100 for making an example semiconductor device 200 (hereinafter, the device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate a three-dimensional and cross-sectional views of the device 200 during intermediate steps of method 100. In particular, FIG. 2 illustrates a three-dimensional view of the device 200 at an initial stage of the method 100. FIGS. 3A-20A illustrate cross-sectional views of the device 200 taken along the plane A-A' shown in FIG. 2 (that is, in a Y-Z plane); FIGS. 3B-20B illustrate cross-sectional views of the device 200 taken along the plane B-B' shown in FIG. 2 (that is, in an X-Z plane); FIGS. 10C-20C illustrate cross-sectional views of the device 200 taken along the plane C-C' shown in FIG. 2 (that is, in another Y-Z plane); FIGS. 10D-20D illustrate cross-sectional views of the device 200 taken along the plane D-D' shown in FIG. 2 (that is, in yet another Y-Z plane); and FIG. 21 illustrates a top view of the device 200 taken along the plane E-E' (that is, in the X-Y plane) shown in FIGS. 20A-20D.

In some embodiments, the device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations.

Figure 3B:
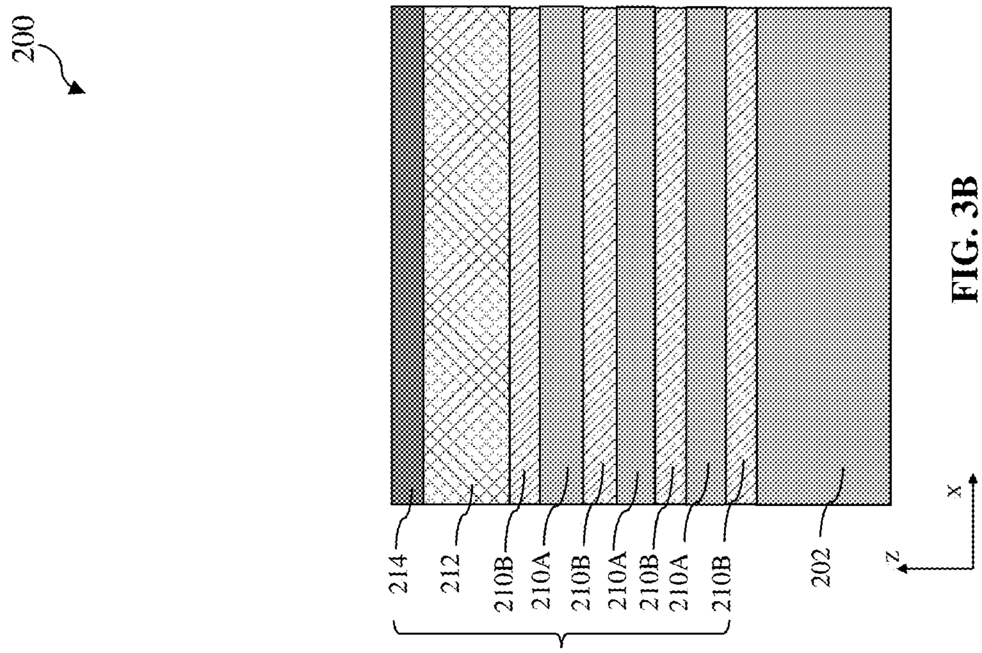
Figure 3A:
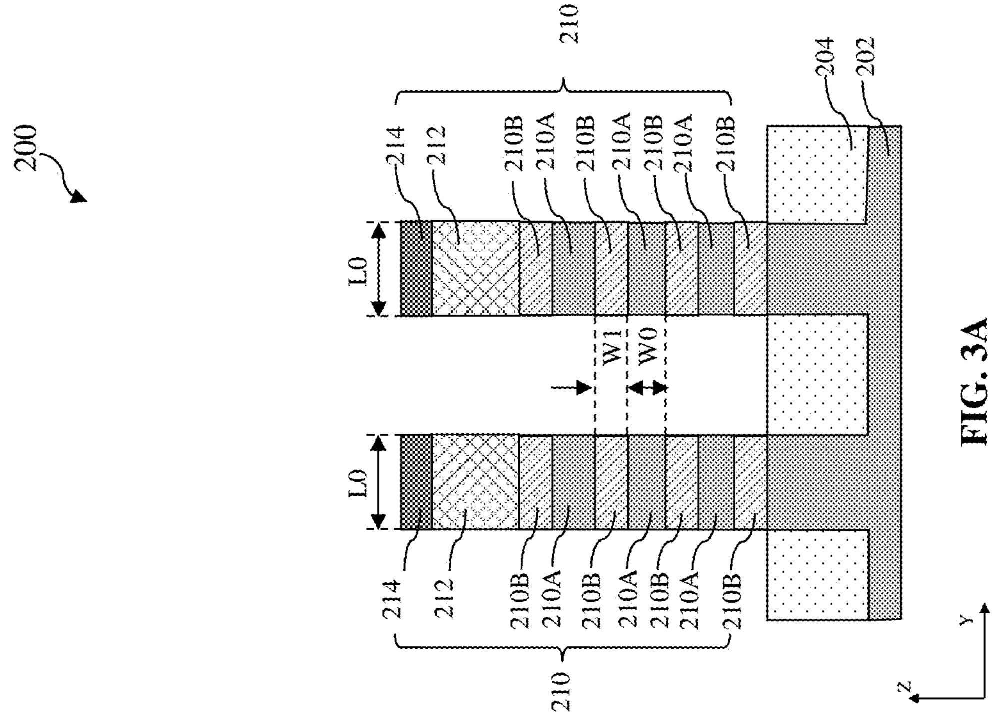

Referring to FIGS. 1, 2, 3A and 3B, at operation 102, an initial semiconductor structure of device 200 is formed. As depicted in FIGS. 2 and 3A/3B, the device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. For example, the substrate 202 may include PFET region comprising n-type doped substrate regions (such as n-well) and NFET region comprising p-type doped substrate regions (such as p-well).

The device 200 also comprises semiconductor layer stacks 210 (hereinafter, stacks 210) formed over the substrate 202. In the depicted embodiment, the stacks 210 comprise alternating semiconductor layers, such as semiconductor layers 210A including a first semiconductor material and semiconductor layers 210B including a second semiconductor material that is different from the first semiconductor material. The different semiconductor materials in the semiconductor layers 210A and 210B have different oxidation rates and/or different etch selectivity. In some embodiments, the first semiconductor material of the semiconductor layers 210A is the same as the substrate 202. For example, the semiconductor layers 210A comprise silicon (Si, like the substrate 202), and the semiconductor layers 210B comprise silicon germanium (SiGe). Thus, the stack 210 is arranged with alternating SiGe/Si/SiGe/Si/ . . . semiconductor layers from bottom to top. In some embodiments, the material of the top semiconductor layer may or may not be the same as the bottom semiconductor layer in the stack. For example, for a stack that comprises alternating SiGe and Si layers, the bottom semiconductor layer comprises SiGe, and the top semiconductor layer may comprise Si or SiGe. In the depicted embodiment, both the bottom semiconductor layer and the top semiconductor layer comprise SiGe. In some embodiments, the semiconductor layers 210A may be undoped or substantially dopant-free. In other words, no intentional doping is performed when forming the semiconductor layers 210A. In some other embodiments, the semiconductor layers 210A may be doped with a p-type dopant or an n-type dopant. The number of the semiconductor layers 210A and 210B in the stack 210 depends on the design of device 200. For example, the stack 210 may comprise one to ten layers of semiconductor layers 210A or 210B each. In some embodiments, different semiconductor layers 210A and 210B in the stack 210 have the same thickness in the Z-direction. In some other embodiments, different semiconductor layers 210A and 210B in the stack 210 have different thicknesses. For example, referring to FIG. 3A, each of the semiconductor layers 210A has a thickness W0 in the Z-direction, and each of the semiconductor layers 210B has a thickness W1 in the Z-direction. In some embodiments, the thickness W0 is substantially equal or larger than the thickness W1. For example, the thickness W0 is about 5 nm to about 30 nm and the thickness W1 is about 5 nm to about 20 nm.

Referring to FIGS. 3A and 3B, in some embodiments, the stacks 210 may also include various hard mask layers on top of the semiconductor layers 210A and 210B. In the depicted embodiment, hard mask layers 212 and 214 are deposited after the deposition of the top semiconductor layer 210B. The hard mask layers 212 and 214 may each include any suitable dielectric material, such as semiconductor oxide (SiO), semiconductor nitride (SiN), and/or silicon carbonitride (SiCN).

The stacks 210 are formed over the substrate 202 by any suitable process. In some embodiments, the semiconductor layers 210A and/or 210B are formed by suitable epitaxy process. For example, semiconductor layers comprising SiGe and Si are formed alternately over the substrate 202 by a chemical vapor deposition (CVD) process (for example, vapor-phase epitaxy (VPE), ultra-high vacuum CVD (UHV-CVD), low-pressure CVD (LPCVD), a metal organic CVD (MOCVD) process, and/or a plasma-enhanced CVD (PECVD)), a molecular beam epitaxy (MBE) process, other suitable epitaxial growth process, or combinations thereof. Thereafter, the hard mask layers 212 and 214 are deposited over the semiconductor layers by CVD, physical vapor deposition (PVD), atomic layer deposition (ALD), other suitable deposition process, or combinations thereof. Subsequently, a photoresist and an etching process may be performed to the semiconductor layers and the hard mask layers to form the stacks 210 in a fin-shape, as illustrated in FIGS. 2 and 3A. Each of the stack 210 has a length LO in the Y-direction. In some embodiment, the length LO is about 10 nm to about 50 nm. The fin-shape stack 210 extends along the X-direction and comprises a channel region, a source region, and a drain region (hereinafter both referred to as S/D regions). As illustrated in FIG. 2, the plane A-A' is taken in the S/D region of the stack 210; the planes B-B' is taken along the extension of the stack 210. The planes C-C' and D-D' are taken along the gate structures 232 in the channel region and the spacers 238 (both will be formed later), respectively. Since the cross-section views in the planes C-C' and D-D' are the same as the one in the plane A-A' before the formation of the dummy gate structures 232, the cross-section views in the planes C-C' and D-D' before the formation of the dummy gate structures are omitted.

The device 200 also comprises an isolation feature 204 formed over the substrate 202 to separate and isolate the active regions. In some embodiments, one or more dielectric materials, such as SiO and/or SiN, is deposited over the substrate 202 along sidewalls of the stack 210. The dielectric material may be deposited by CVD (such as PECVD), PVD, thermal oxidation, or other techniques. Subsequently, the dielectric material is recessed (for example, by etching) to form the isolation feature 204. In some embodiments, a top surface of the isolation feature 204 is substantially coplanar with or below a bottom surface of the lowermost semiconductor layer 210B, as depicted in FIG. 3A.

Figure 4B:
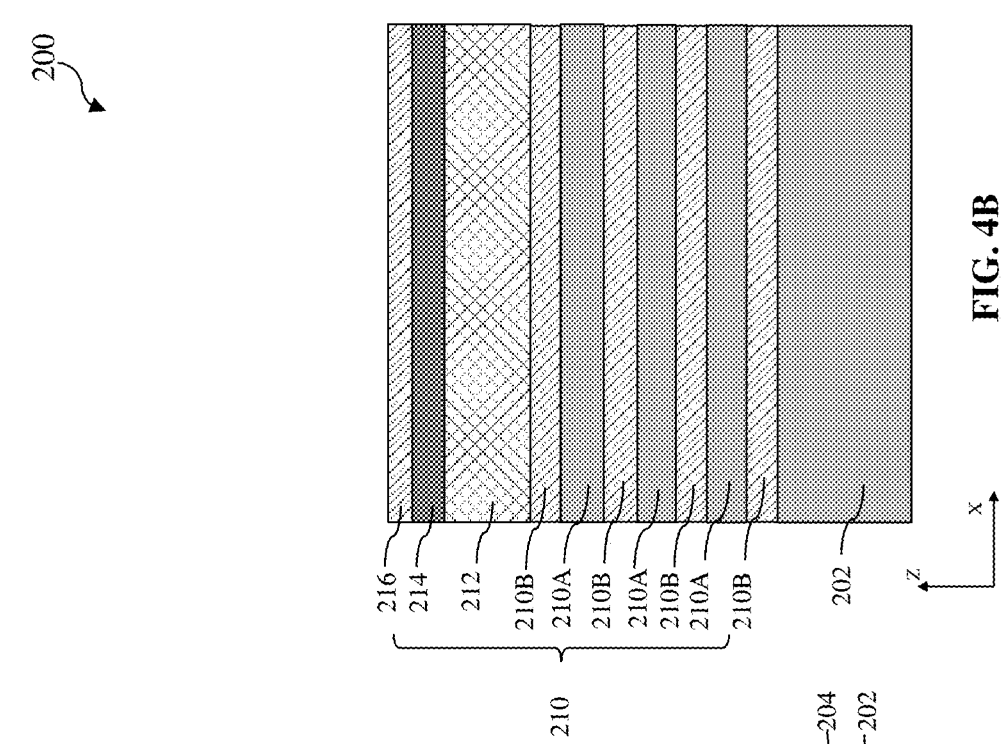
Figure 4A:
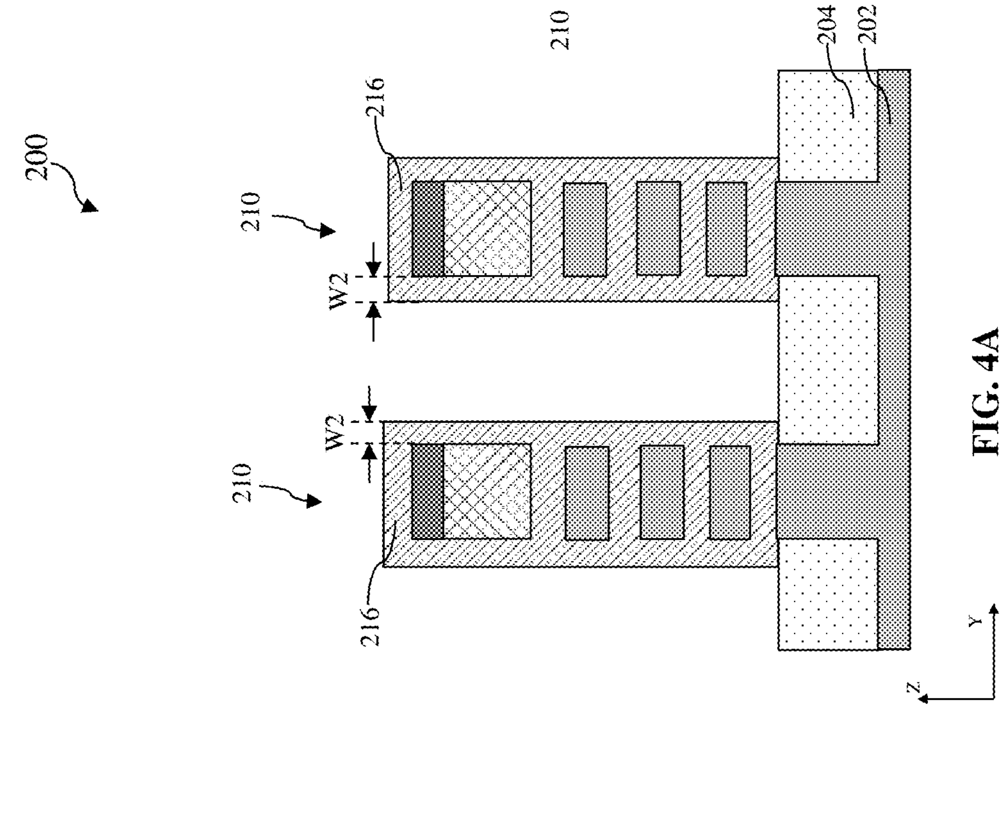

Then, referring to FIGS. 1, 4A and 4B, at operation 104, cladding layers 216 are formed around each of the stacks 210. The cladding layers 216 include the same material as the semiconductor layers 210B. For example, the semiconductor layers 210B include SiGe, the cladding layers 216 also includes SiGe. In some embodiments, the cladding layers 216 are epitaxially grown around the stacks 210, by a MBE process, a CVD (for example, VPE, UHV-CVD, LPCVD, MOCVD, and/or PECVD) process, and/or other suitable epitaxial growth processes. Referring to FIG. 4A, each of the cladding layers 216 has a thickness W2 in the Y-direction. In some embodiments, the thickness W2 is about 5 nm to about 20 nm. The thickness W2 cannot be too small or too large, because if W2 is too small, the metal gate size is limited, thus the contact formation may be challenged; and if the W2 is too large, the space remained for the dummy fin structure is limited.

Figure 5B:
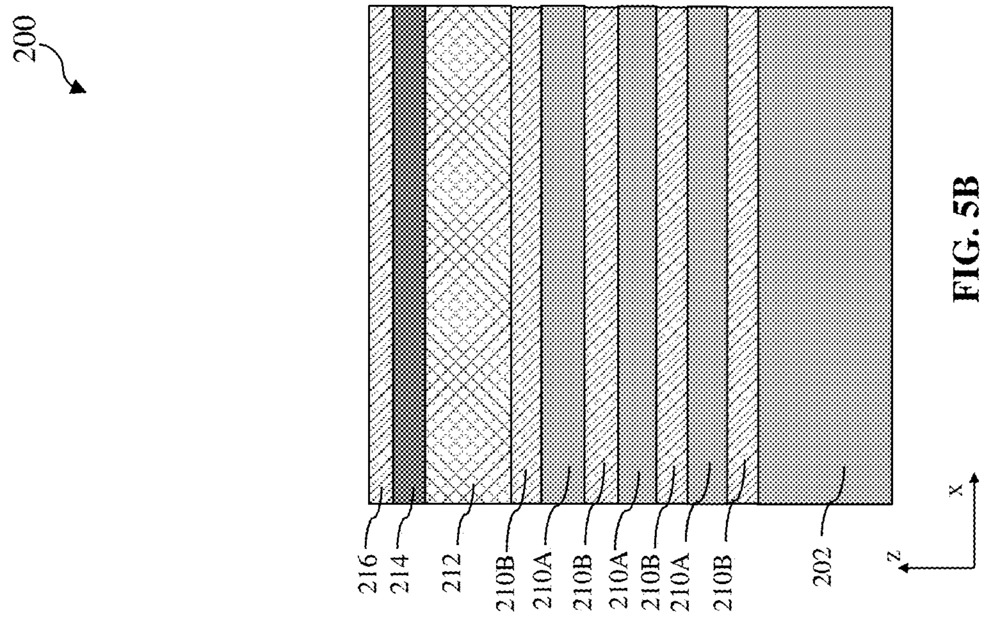
Figure 5A:
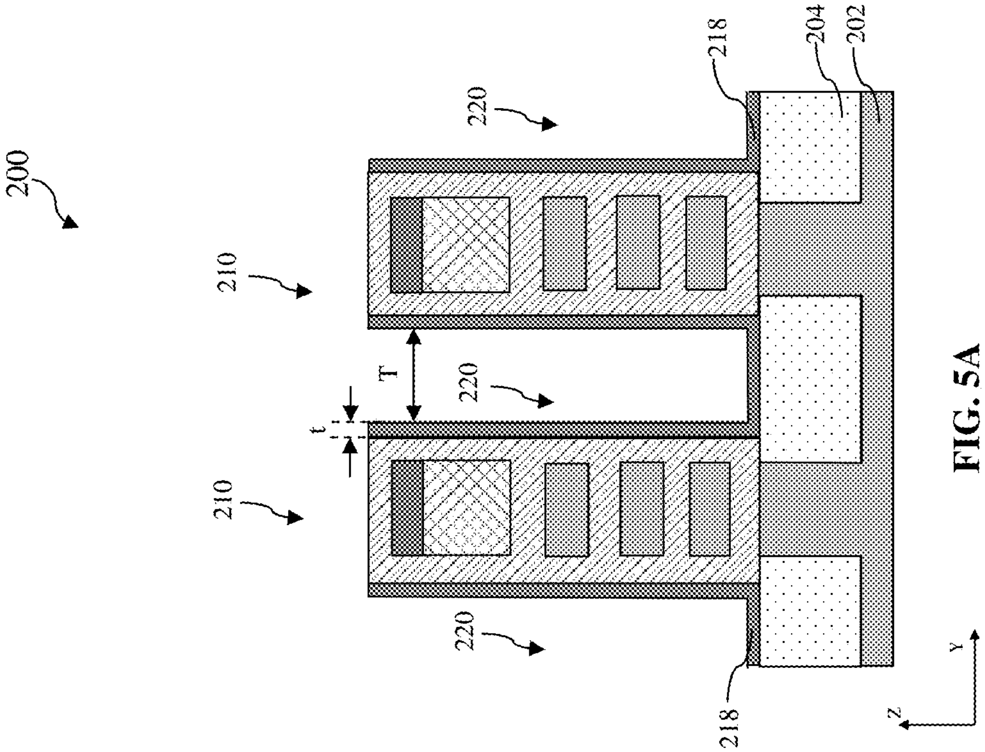
Figure 6B:
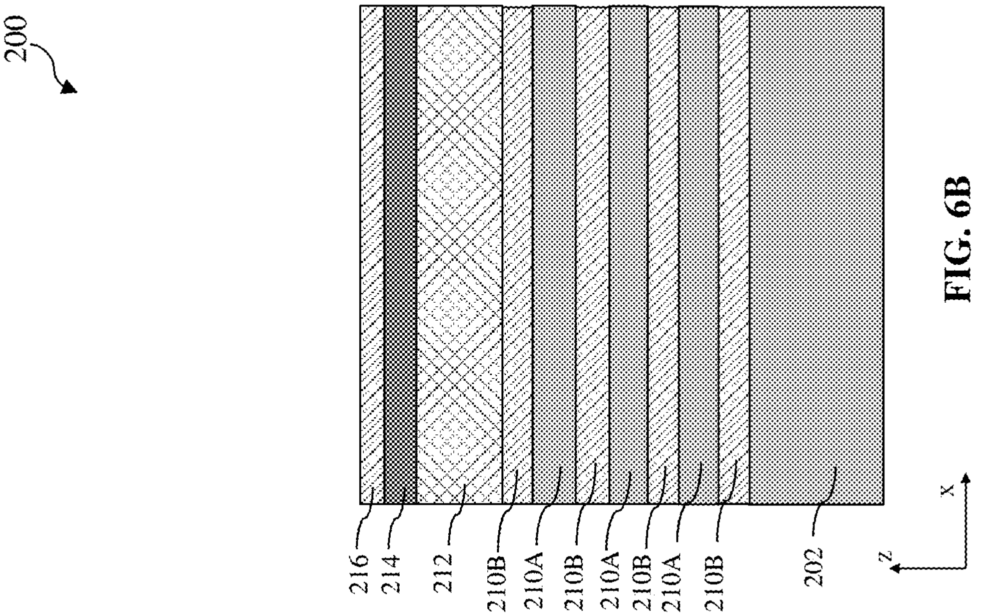
Figure 6A:
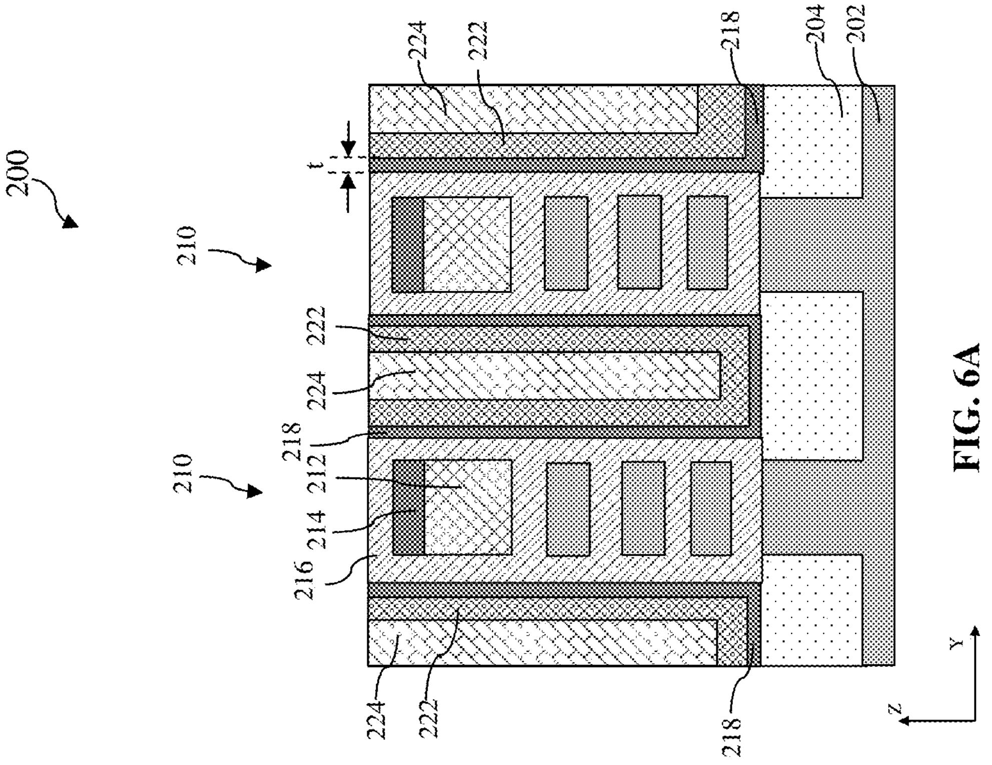

Referring to FIGS. 1, 5A and 5B, at operation 106, liners 218 are formed between the stacks 210. In the depicted embodiments, the liners 218 are deposited along sidewalls of the cladding layers 216 and over the isolation feature 204, thereby a dummy trench 220 is formed therein. In some embodiments, the liners 218 include dielectric materials including silicon and oxygen. For example, the dielectric material of the liners 218 is $SiO_x$, silicon oxynitride (SiON), silicon oxycarbonitride (SiOCN), other proper dielectric material, or combinations thereof. In some embodiments, the liners 218 are conformally deposited between the stacks 210 by ALD or other suitable process. Referring to FIG. 5A, the liners 218 has a thickness t (along all directions since it is conformally deposited) and the dummy trench 220 has a width T in the Y-direction. In some embodiments, the thickness t is about 1 nm to about 2 nm, and the width T is about 5 nm to about 50 nm. A ratio between the thickness t to the width T is about 2% to about 40%. The thickness t of the liner 218 cannot be too thick or too thin. For example, if the thickness t is more than 2 nm, the liner 218 between the gate and the source/drain may be break-through at channel semiconductor layer formation (sheet release and liner removal) stage, which may cause metal to source/drain bridging issue. Or, if the thickness t is too small, the liner 218 is too thin to enlarge the metal gate patterning window, thereby to mitigate the overlay shifting issue during the metal gate etching process.

Referring to FIGS. 1, 6A, 6B, 7A, 7B, and 8A, 8B, at operation 108, dummy fin structures 228 are formed in the dummy trenches 220 between the stacks 210. The dummy fin structures 228 (illustrated in dashed lines in FIG. 2) are formed by various steps. For example, referring to FIGS. 6A and 6B, a first dummy layer 222 is deposited over the liners 218 and a second dielectric layer 224 is deposited over the first dummy layer 222. The first dummy layer 222 and the second dielectric layer 224 together fill up the dummy trenches 220. In some embodiments, the first dummy layer 222 includes a low-k ($k \leq 3.9$) dielectric material that is different from the dielectric material of the liner 218, such as SiN, SiCN, SiON, SiOCN, tetraethylorthosilicate (TEOS), un-doped silicate glass, or doped SiO such as borophosphosilicate glass (BPSG), fluorosilicate glass (FSG), phosphosilicate glass (PSG), boron doped silicon glass (BSG), other suitable dielectric materials, or combinations thereof. The second dielectric layer 224 may also include a low-k dielectric material which is different from the first dummy layer 222. In some embodiments, the dummy layers 222 and 224 are formed by deposition process, such as ALD, CVD, PVD, and/or other deposition process.

Figure 7B:
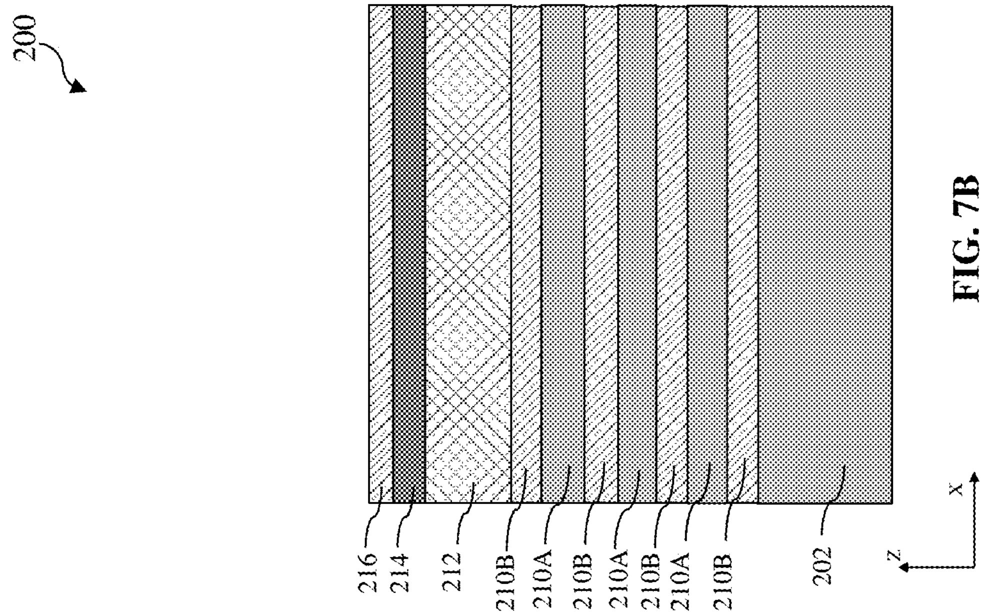
Figure 7A:
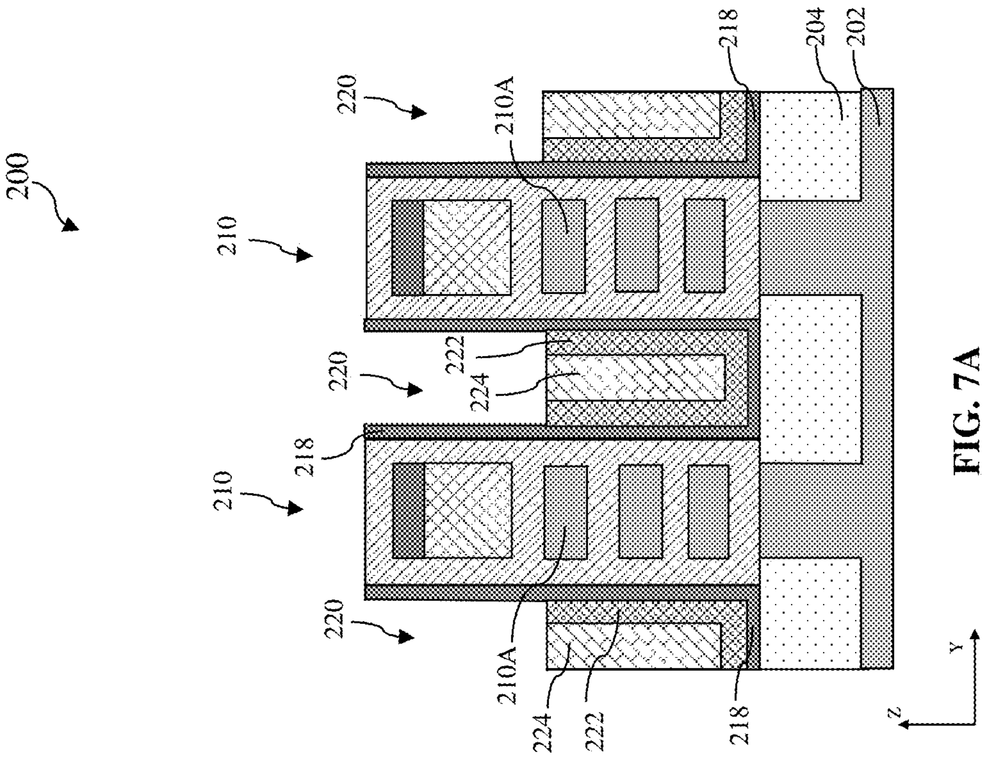

Referring to FIGS. 7A and 7B, the dummy layers 222 and 224 are then etched back to expose the top portions of the dummy trenches 220. In some embodiments, the top surfaces of the dummy layers 222 and 224 are substantially co-planer with or below a top surface of the topmost semiconductor layer 210A in the stack 210. In some embodiments, the etching back process includes wet etching, dry etching, or combinations thereof. Due to the different selectivity of the materials of the liners 218 and the dummy layers 222 and 224, the liners 218 are substantially unchanged during the etching back process.

Figure 8B:
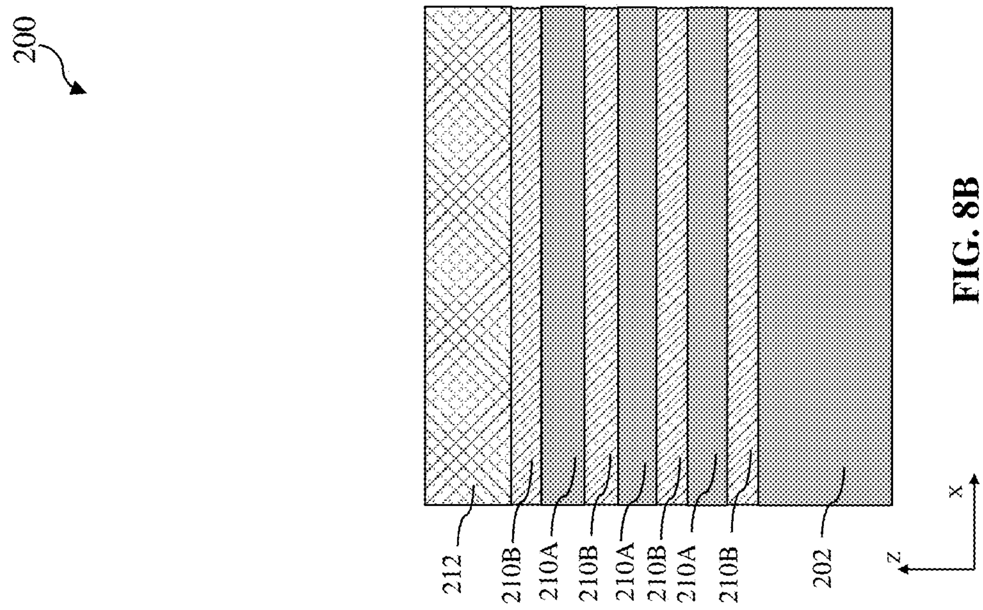
Figure 8A:
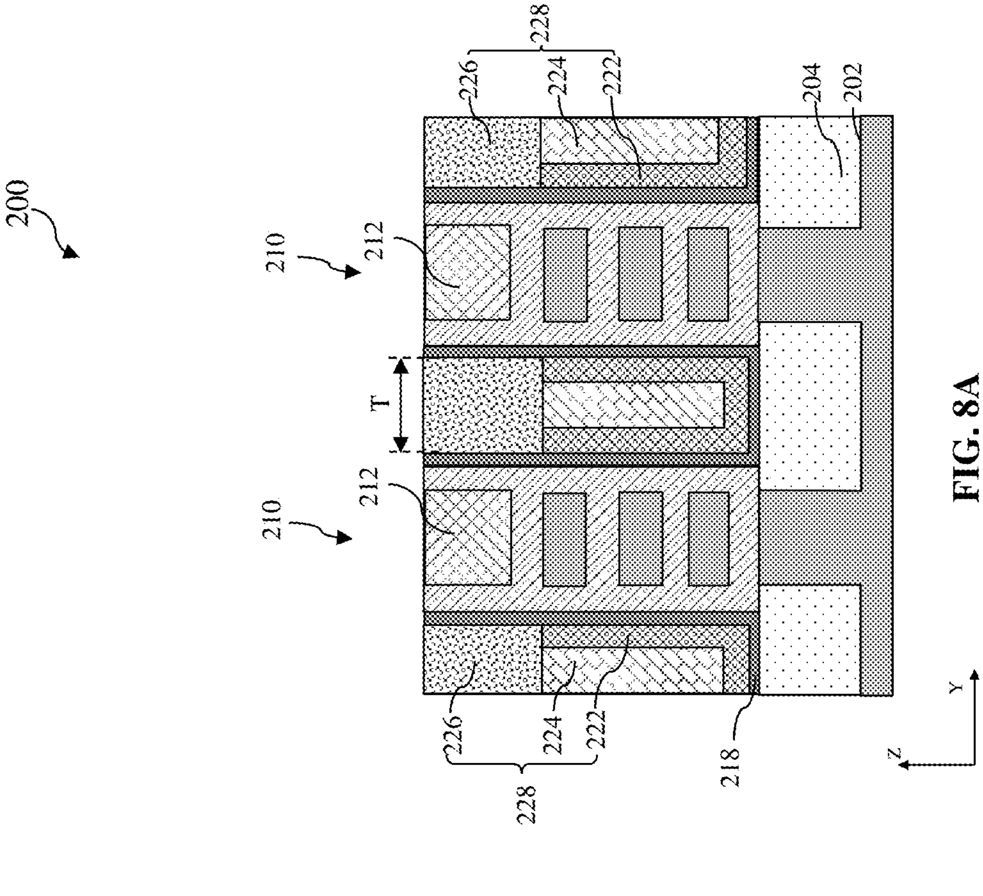
Figure 9B:
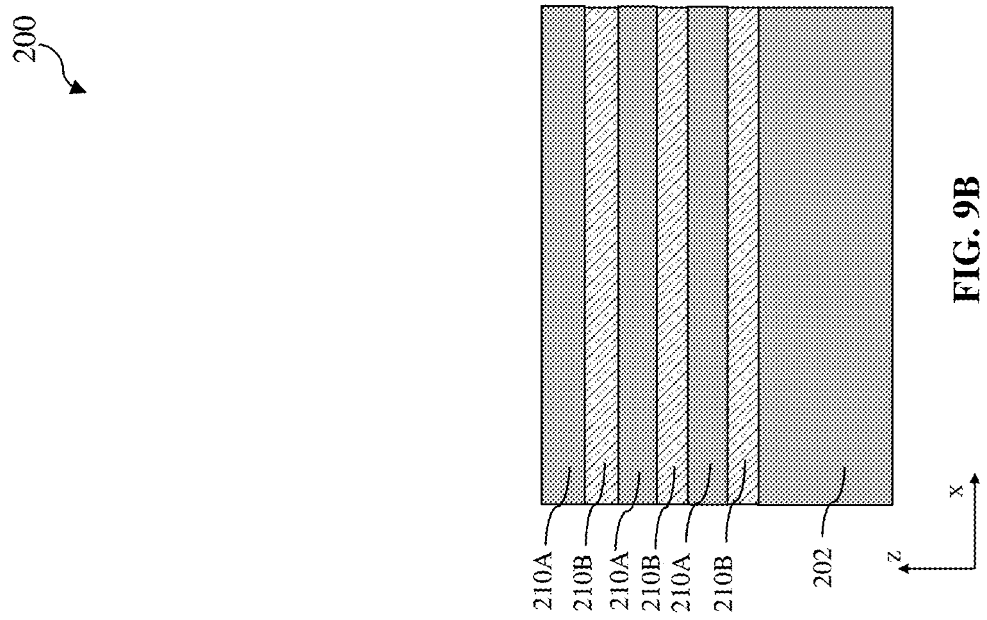
Figure 9A:
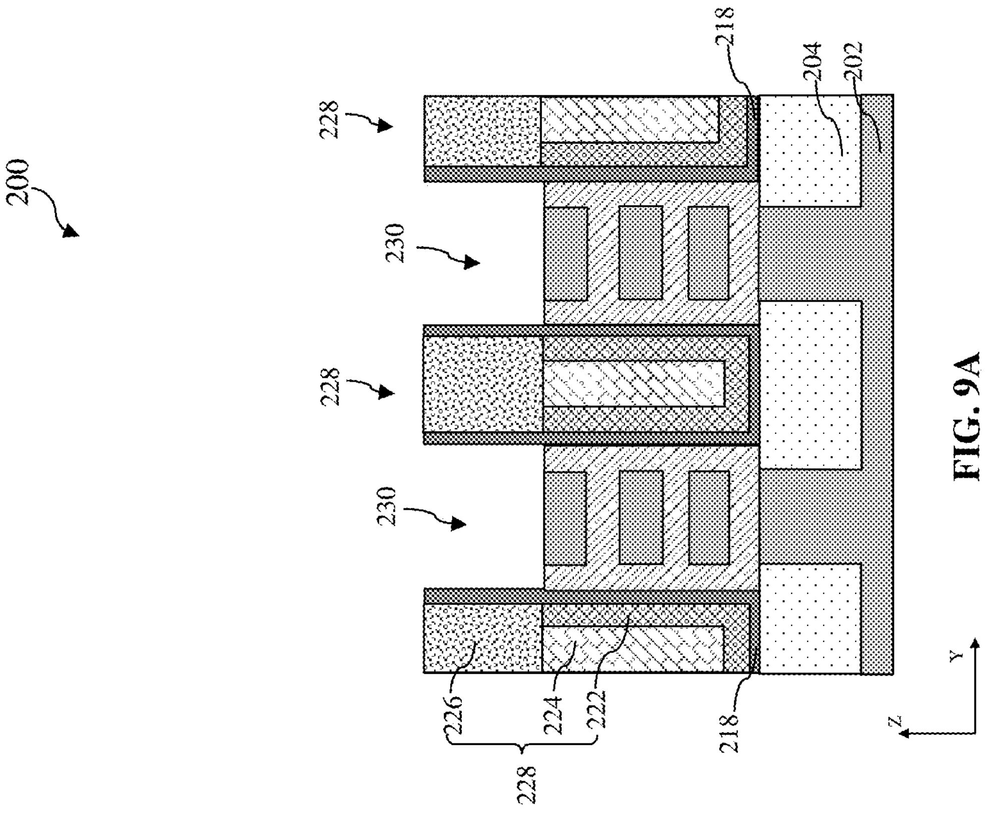

Thereafter, referring to FIGS. 8A and 8B, dummy features 226 are formed to fill up the top portions of the dummy trenches 220. In some embodiments, the dummy features 226 include a dielectric material different from that of the liner 218, such as SiO, SiN, SiON, SiCN, SiOCN, HfSiO, ZrSiO, AlSiO, other dielectric material, or combinations thereof. In some embodiments, the dielectric material is deposited by CVD, PVD, or other suitable process within the dummy trenches 220 and over the stacks 210. Subsequently, a planarization process, (for example, a CMP process) is performed to remove the excess dielectric material of the dummy feature 226 as well as a top portion of the stack 210 (for example, portion of the cladding layer 216 and the hard mask layer 214), until the hard mask layer is exposed. The remained portion of the dummy feature 226 and the dummy layers 222 and 224 form the dummy fin structure 228, wherein the dummy feature 226 forms an upper portion of the dummy fin structure 228, and the dummy layers 222 and 224 form a lower portion of the dummy fin structure 228. Referring to FIG. 8A, a width of the dummy fin structure 228 in the Y-direction is T, which is about 5 nm to about 50 nm. The width T is decided by the distance between the stacks 210 and the thickness of the cladding layer 216 and the liner 218.

Referring to FIGS. 1, 9A, 9B, and 10A-10D, at operation 110, dummy gate structures 232 are formed over the channel regions of the stacks 210. First, referring to FIGS. 9A and 9B, the stacks 210 are recessed to expose the topmost semiconductor layer 210A. For example, the hard mask layer 212, the topmost semiconductor layer 210B, and top portions of the cladding layer 216 are removed by etching process (for example, wet etching, dry etching, or combinations thereof). Thereby, trenches 230 are formed in the place of the recessed portion of the stacks 210. The bottom surface of the trench 230 is substantially co-planar with or above the bottom surface of the dummy feature 226.

Figure 10B:
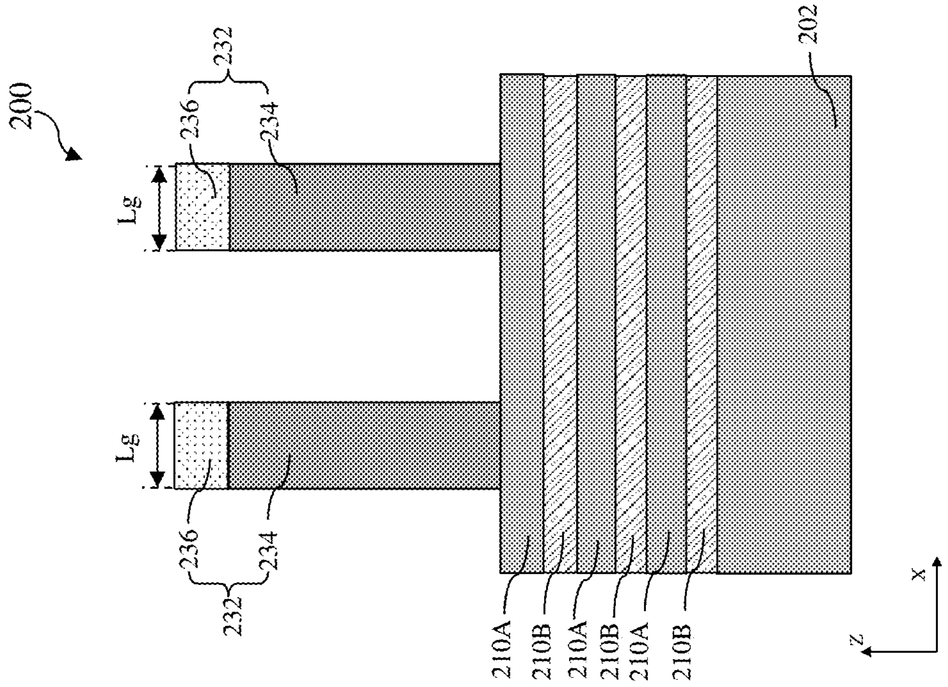
Figure 10A:
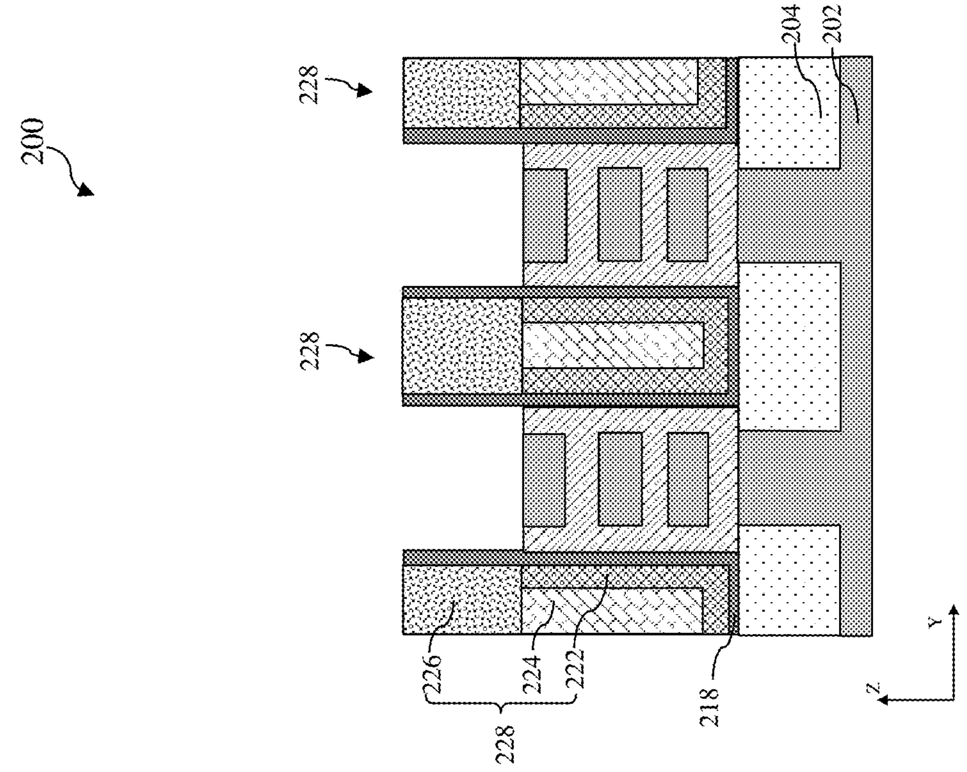
Figure 10D:
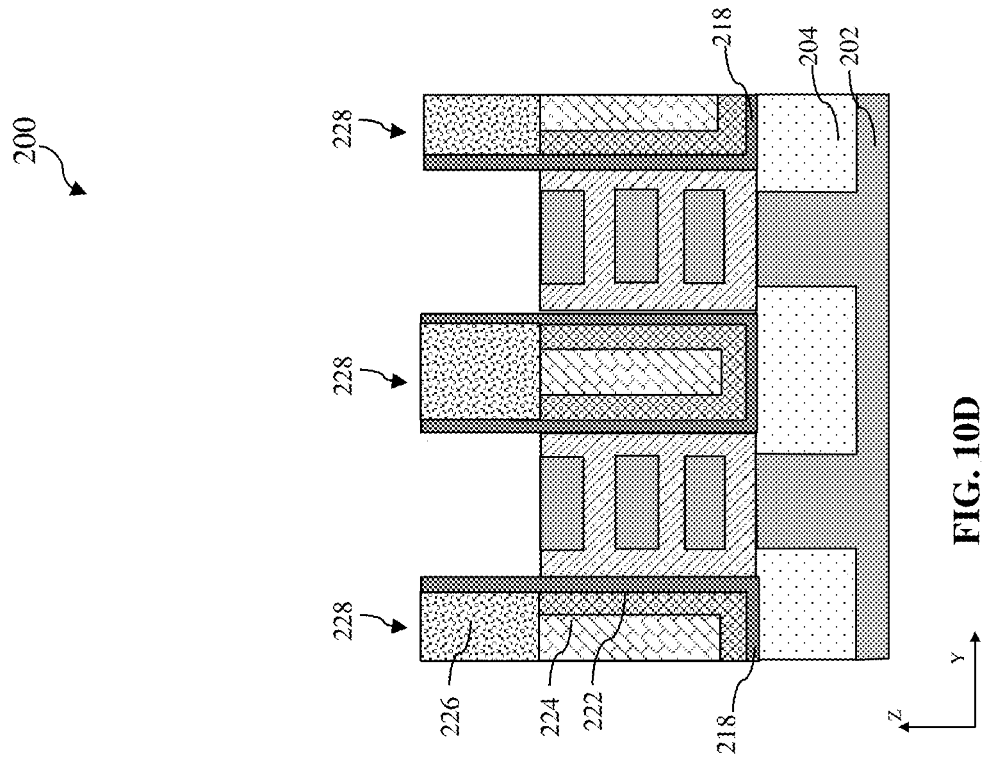
Figure 10C:
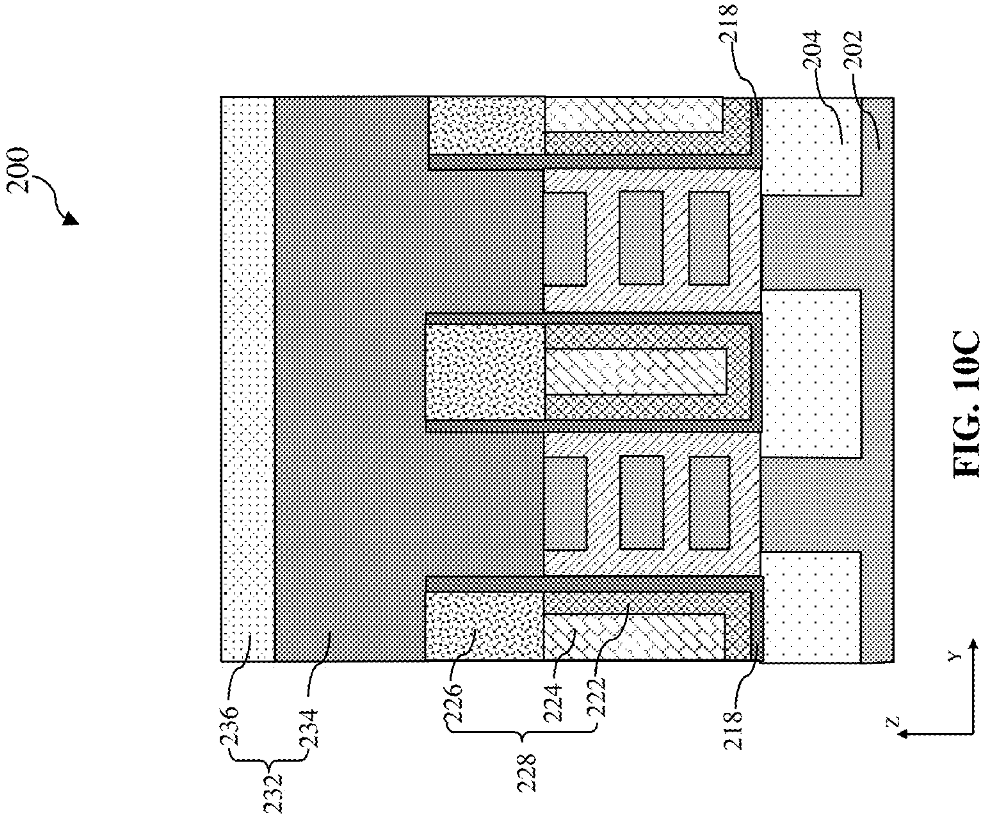
Figure 11B:
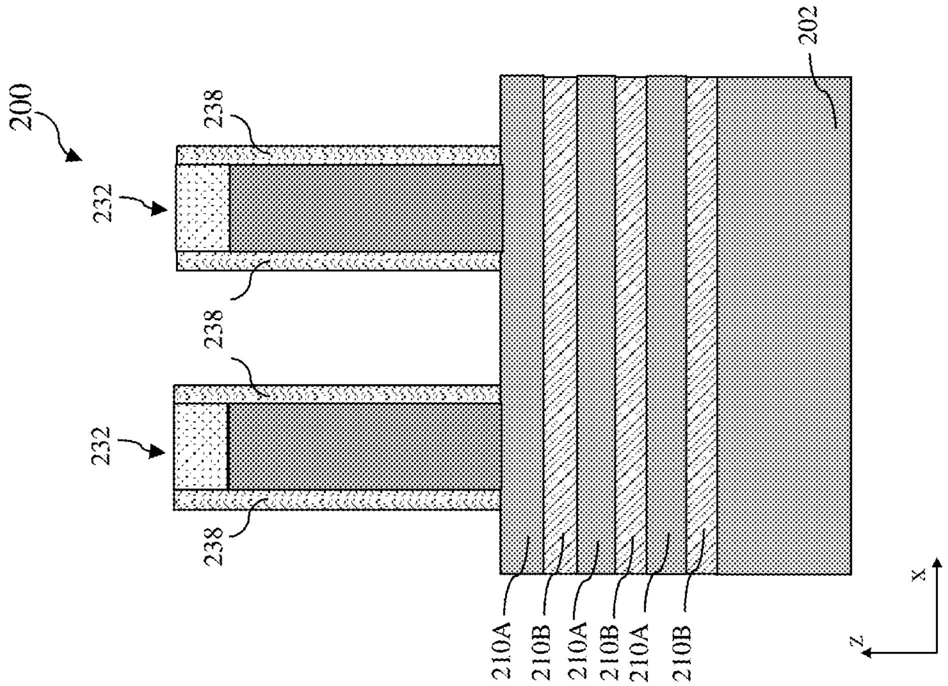
Figure 11A:
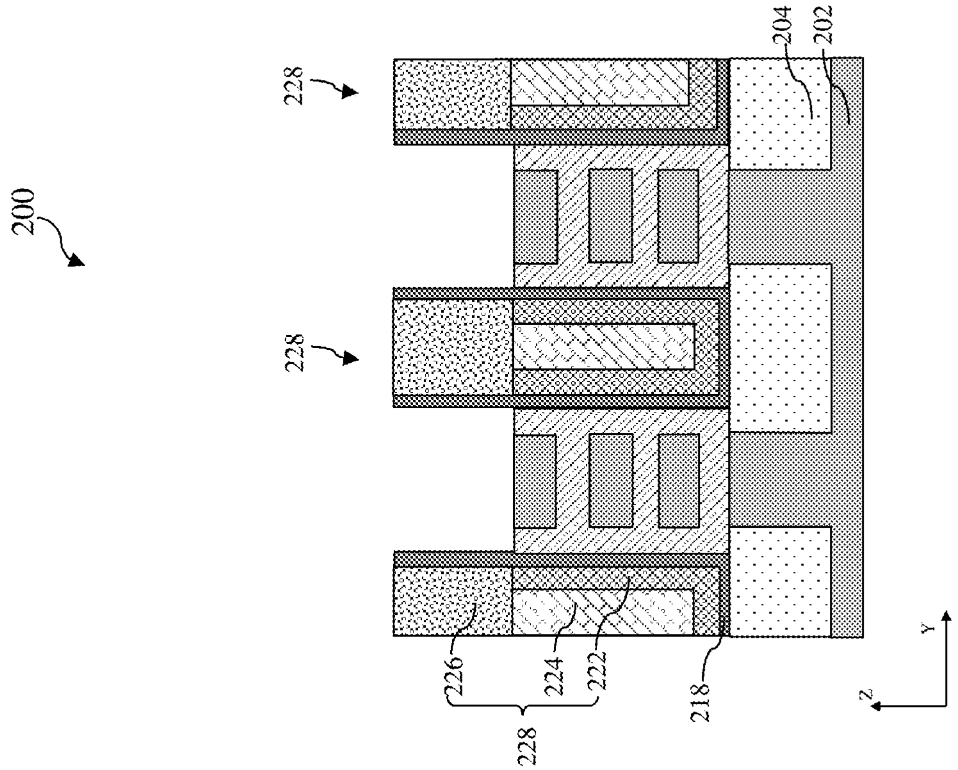
Figure 11D:
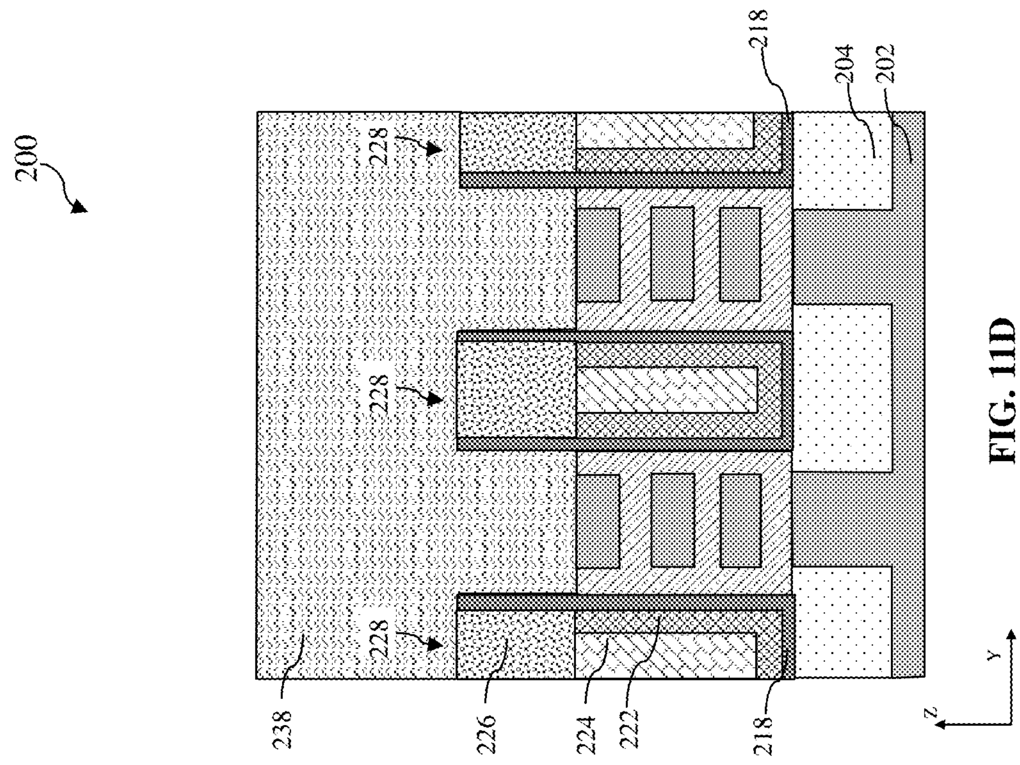
Figure 11C:
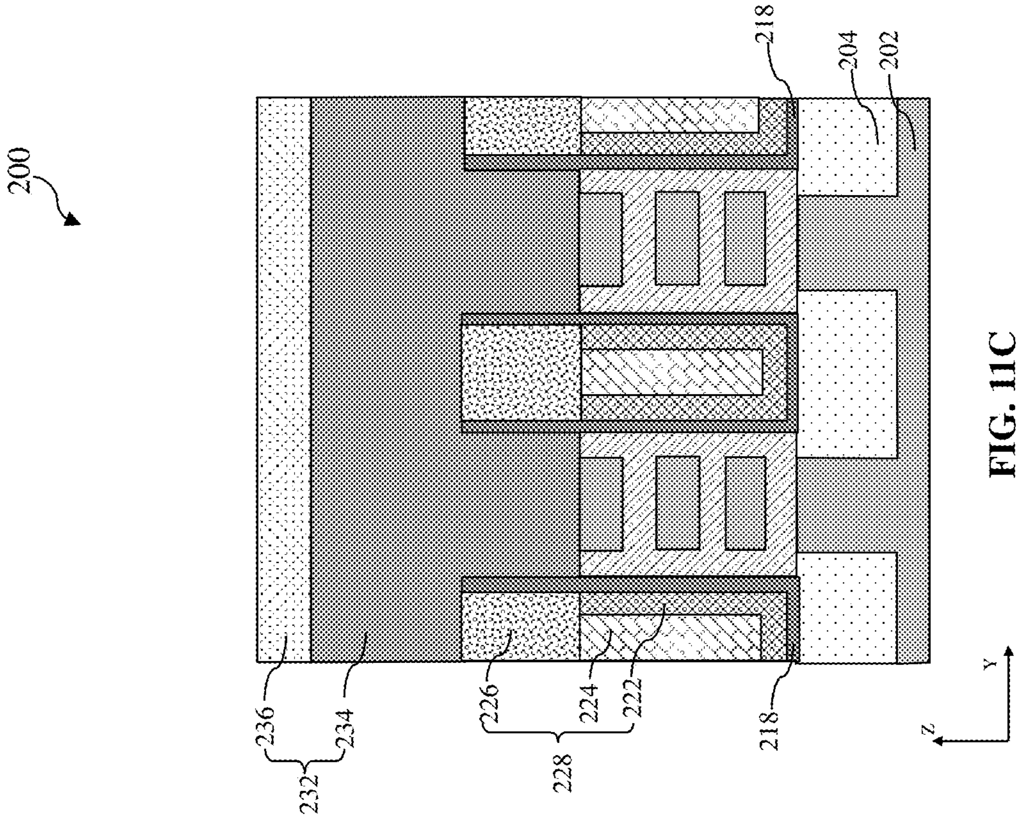

Referring to FIGS. 10A-10D, dummy gate structures 232 are formed over the channel regions of the stacks 210. The dummy gate structures 232 are also illustrated in dashed lines in FIG. 2, thus it is clear that the plane C-C' is along the dummy gate structures 232 (i.e. in the channel regions). Each dummy gate structure 232 serves as a placeholder for subsequently forming a metal gate structure. In some embodiments, the dummy gate structures 232 extend along the Y-direction and traverse respective stacks 210. The dummy gate structures 232 cover the channel regions of the stacks 210 which interpose the source regions and the drain regions (both referred to as the S/D regions). Each of the dummy gate structures 232 may include various dummy layers. For example, an interfacial layer (not shown) over the stacks 210, a dummy gate electrode 234 (for example, including polysilicon) over the interfacial layer, and one or more hard mask layers 236 (for example, including a dielectric material such as SiN, SiCN, SiO, etc.) over the dummy gate electrode 234, and/or other suitable layers. The dummy gate structures 232 are formed by deposition processes, lithography processes, etching processes, other suitable processes, or combinations thereof. For example, referring to FIG. 10C, different dummy gate layers are deposited over the stacks 210 and the dummy fin structures 228. The trenches 230 are also filled with the dummy gate layers. A lithography process is then performed to form a mask covering the channel regions of the stacks 210. Thereafter, the different dummy gate layers are etched using the lithography mask to form the dummy gate structures 232 (FIG. 10B). The lithography mask is then removed using any proper method (such as an ashing process). Referring to FIG. 10B, the dummy gate structures 232 has a gate length Lg in the X-direction. In some embodiments, depends on the design requirements of the device 200, the gate length Lg is about 10 nm to about 150 nm.

Referring to FIGS. 1 and 11A-11D, at operation 112, gate spacers 238 are formed along sidewalls of the dummy gate structures 232. The gage spacers 238 are also illustrated in dashed lines in FIG. 2, thus it is clear that the plane D-D' is along the gate spacers 238. In some embodiments, the gate spacers 238 comprise a dielectric material, such as SiN, SiON, SiCN, SiOCN, other dielectric material, or a combination thereof. The formation of the gate spacers 222 involves various deposition and etching processes. In some embodiments, first, a gate spacer layer is deposited (for example, by ALD, CVD, PVD, or other proper process) over the device 200. Next, an anisotropic etching process is performed to remove the gate spacer layer in the X-Y plane (the plane in which the top surface of the substrate 202 is), while keeping the gate spacer layer along the Z-direction (the direction substantially perpendicular to the top surface of the substrate 202). The remained portions of the gate spacer layer along the Z-direction form the gate spacers 238. The anisotropic etching process includes wet etching, dry etching, or combinations thereof.

Figure 12B:
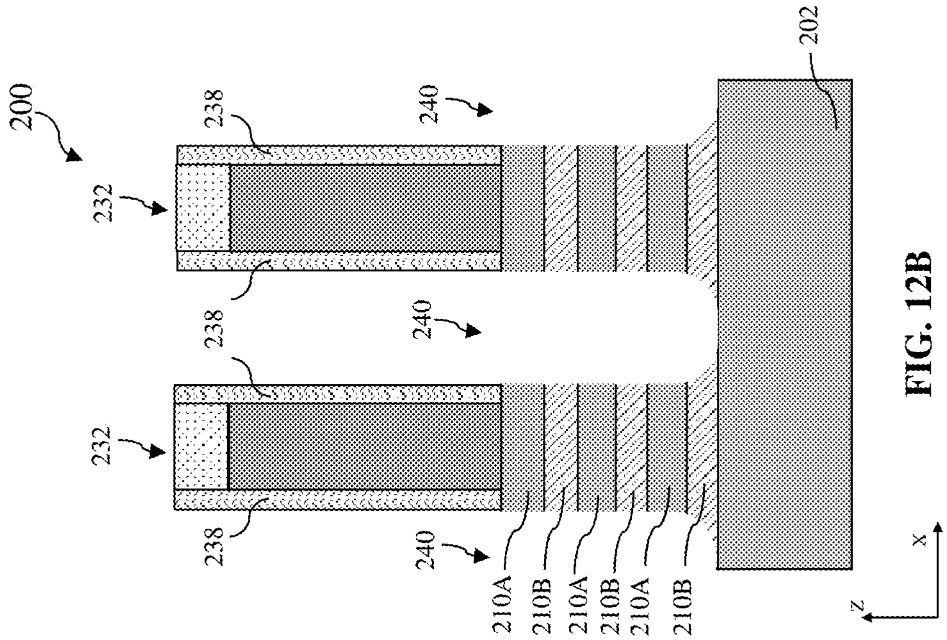
Figure 12A:
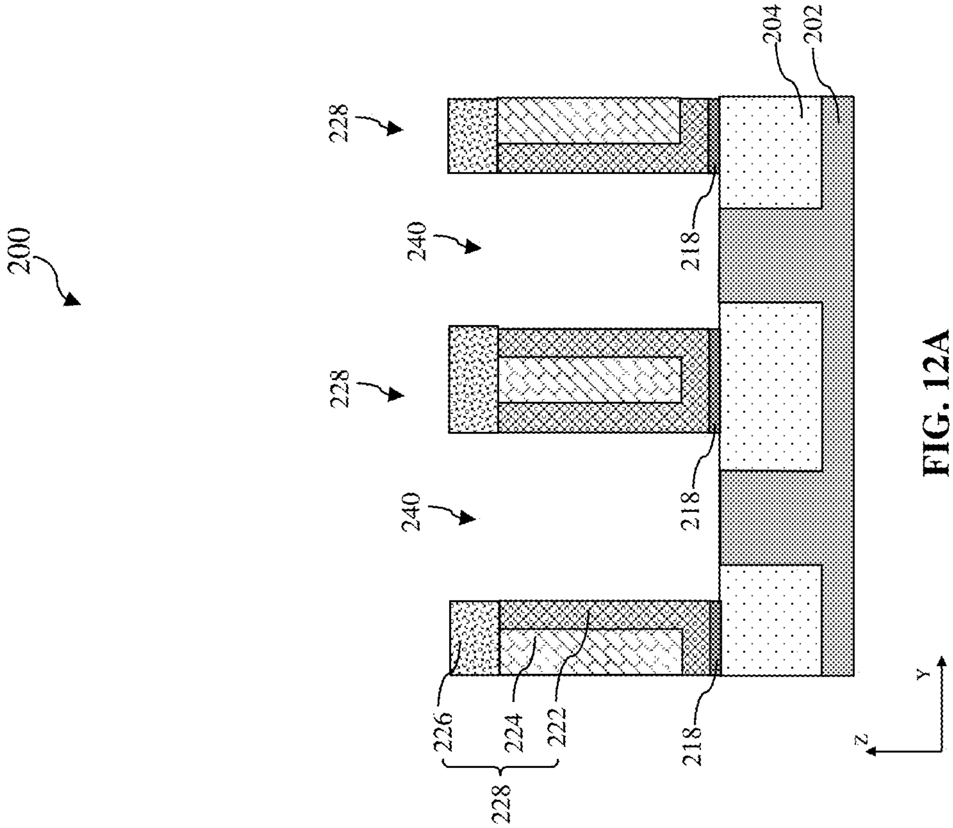
Figure 12C:
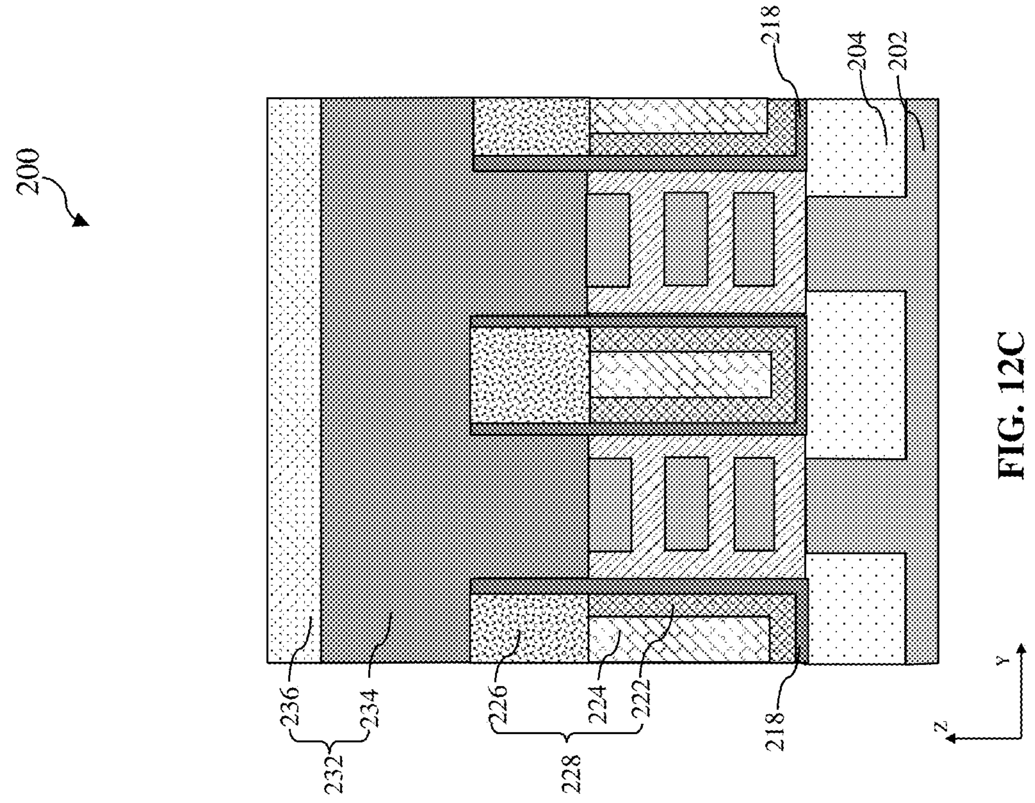
Figure 12D:
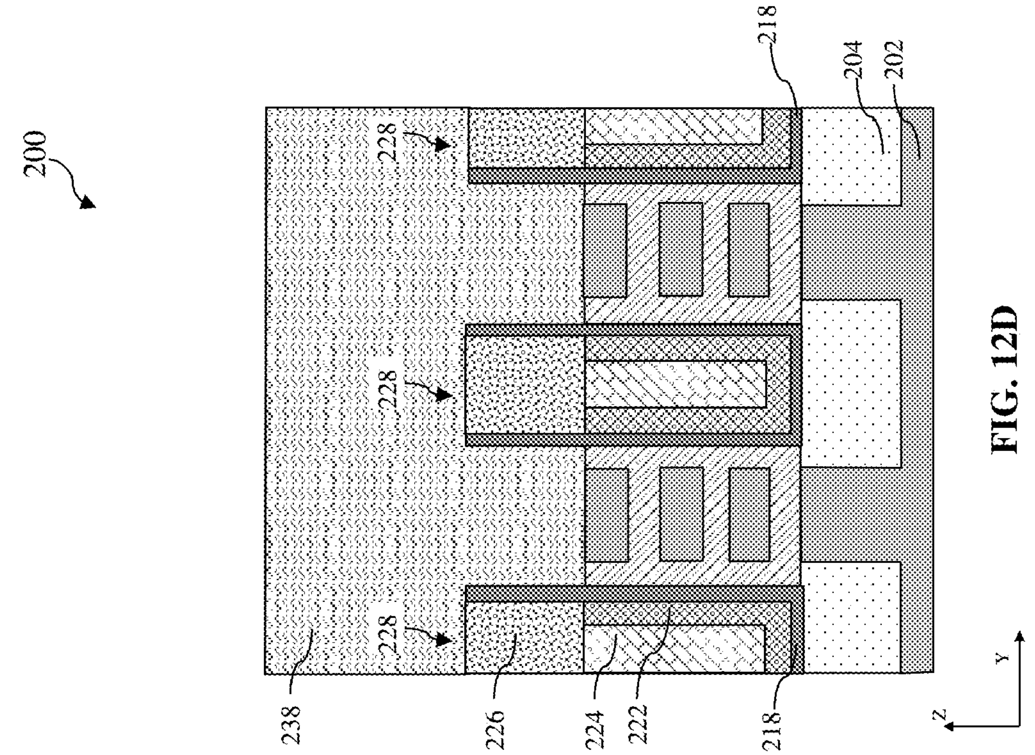

Referring to FIGS. 1 and 12A-12D, at operation 114, S/D regions of the stack 210 may be recessed to form S/D trenches 240. Referring to FIGS. 12A and 12B, the S/D regions of the stack 210 are recessed by a S/D etching process performed along the sidewalls of the gate spacers 238 to form the S/D trenches 240. The S/D etching process also removes the portions of the liners 218 along the sidewalls of the dummy fin structures 228 (i.e. in the Z-direction) while keep the portions of the liners 218 between the dummy fin structures 228 and the isolation feature 204 (i.e. in the X-Y plane) substantially unchanged. In some embodiments, top portions of the dummy fin structure 228 (specifically, the top portions of the dummy feature 226) is removed by the S/D etching process. And, in some further embodiments, the sidewalls of the dummy fin structures 228 are also slightly loss during the S/D etching process. The S/D etching process can be a dry etching process. The duration of the S/D etching process is controlled such that the sidewalls of each semiconductor layers 210A and 210B are exposed in the S/D trenches 240.

Figure 13B:
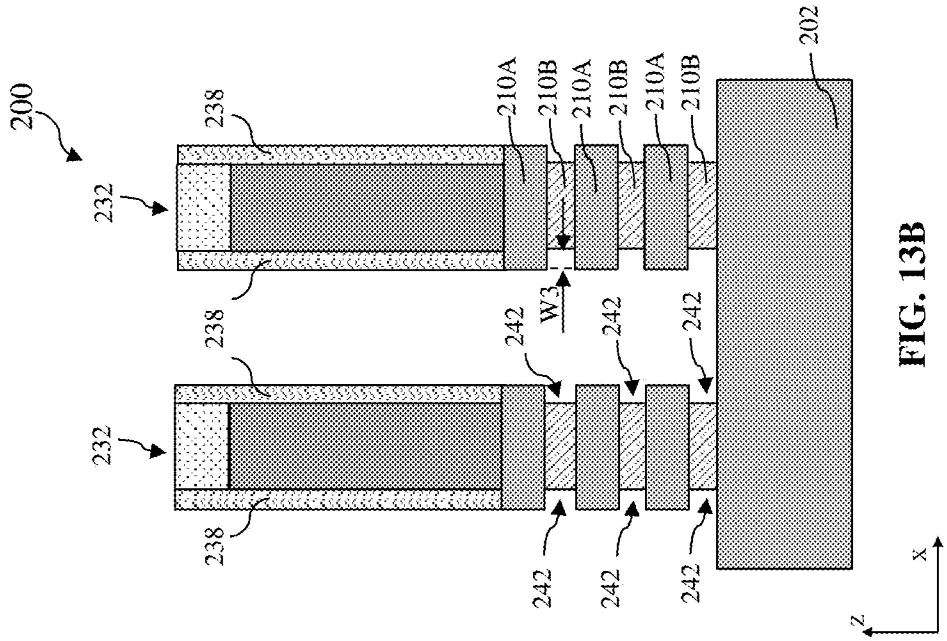
Figure 13A:
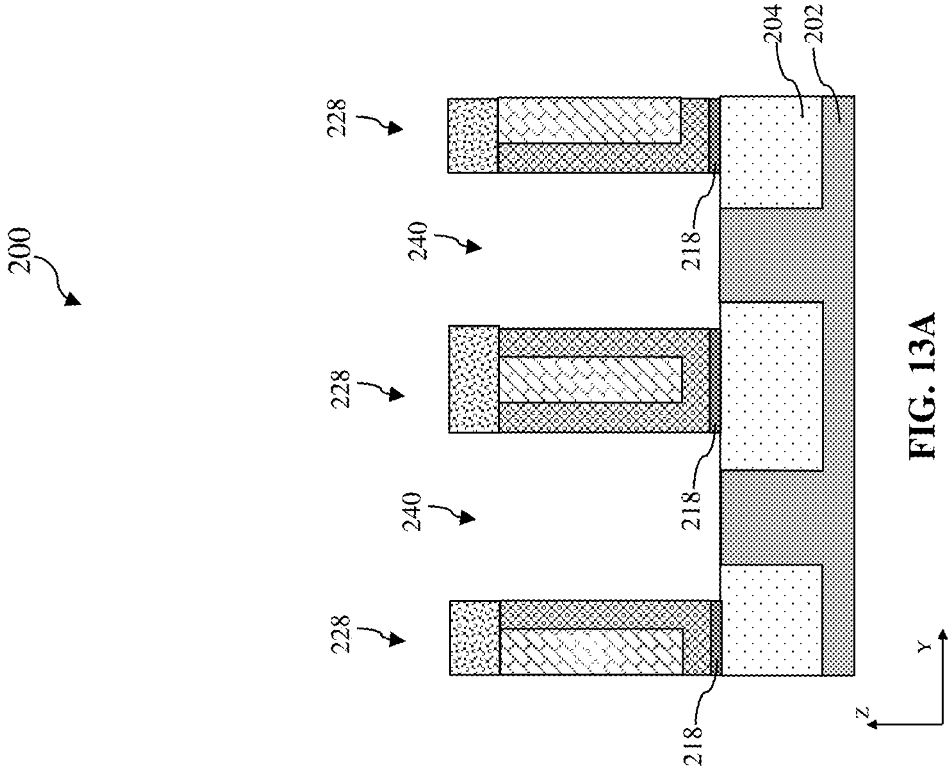
Figure 13D:
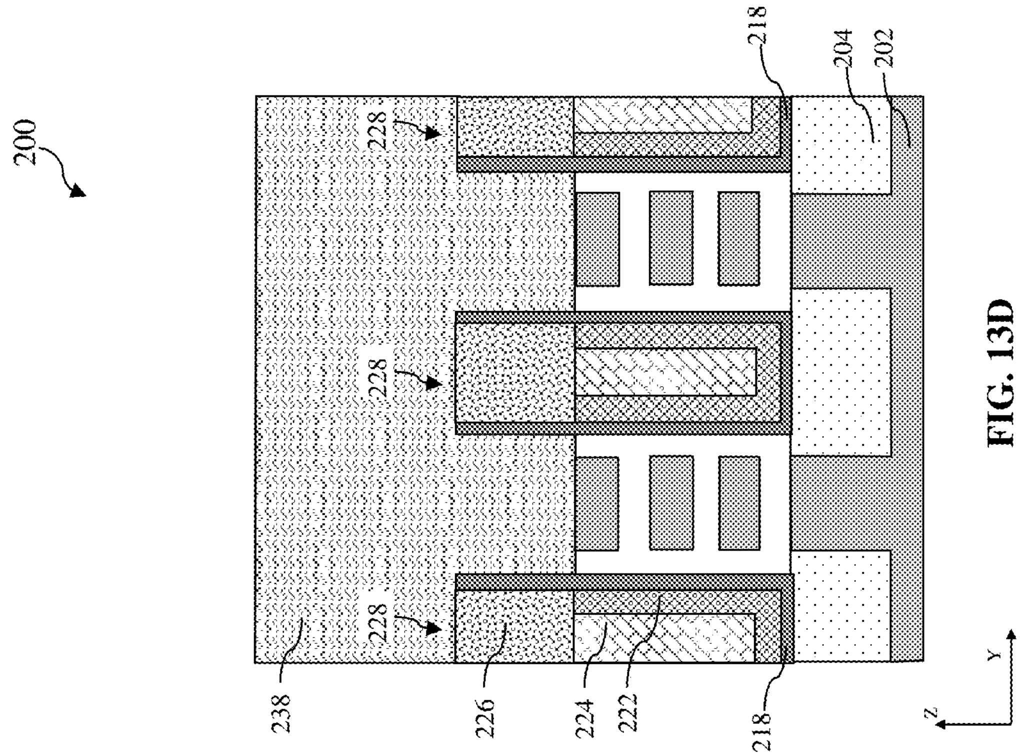
Figure 13C:
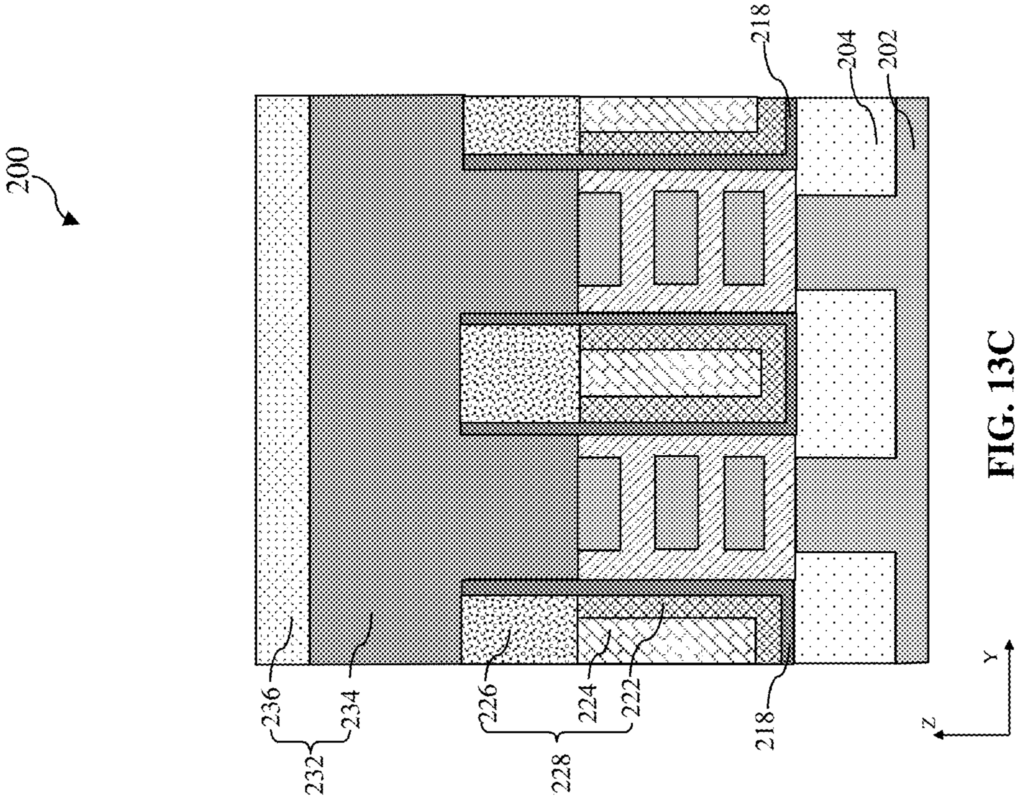

Referring to FIGS. 1, 13A-13D, and 14A-14D, at operation 116, inner spacers 244 are formed between the edges of the semiconductor layers 210A. Referring to FIGS. 13A and 13B, portions (edges) of the semiconductor layers 210B exposed in the S/D trenches 240 are selectively removed by a suitable etching process to form gaps 242 between adjacent semiconductor layers 210A. In other words, edges of the semiconductor layers 210A are suspended in the S/D trenches 240. Due to the different oxidation rates and/or etching selectivities of the materials of the semiconductor layers 210A (for example, Si) and 210B (for example, SiGe), only exposed portions (edges) of the semiconductor layers 210B are removed, while the semiconductor layers 210A remain substantially unchanged. In some embodiments, the selective removal of the exposed portions of the semiconductor layers 210B may include an oxidation process followed by a selective etching process. For example, the edge portions of the semiconductor layers 210B are first selectively oxidized to include a material of SiGeO. Then, a selective etching process is performed to remove the SiGeO with a suitable etchant such as ammonium hydroxide (NH4OH) or hydro fluoride (HF). The duration of the oxidation process and the selective etching process can be controlled such that only edge portions of the semiconductor layers 210B are selectively removed. Referring to FIG. 13B, the gaps 242 (i.e. the removed edge portions of the semiconductor layers 210B) has a width W3 in the X-direction. In some embodiments, the width W3 is about 3 nm to about 10 nm.

Figure 14B:
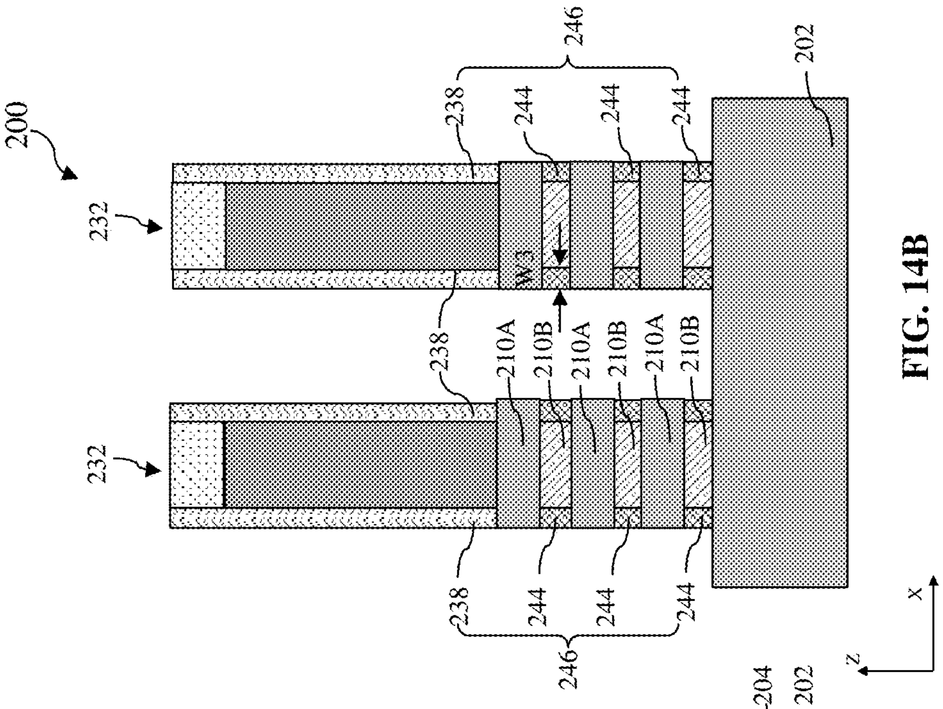
Figure 14A:
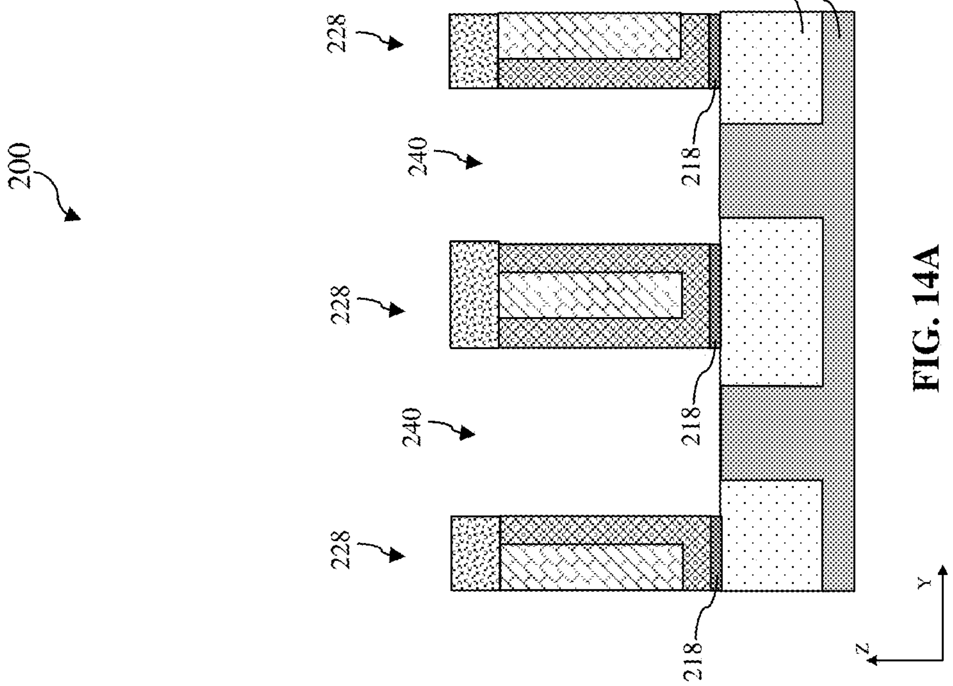
Figure 14D:
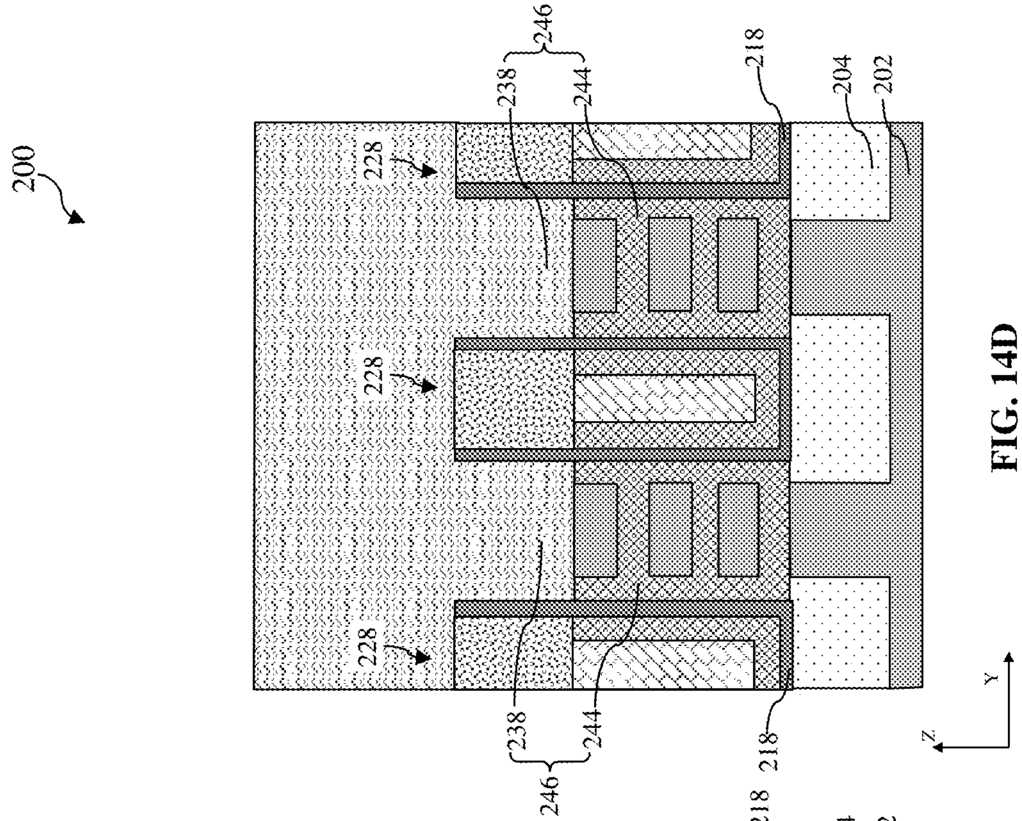
Figure 14C:
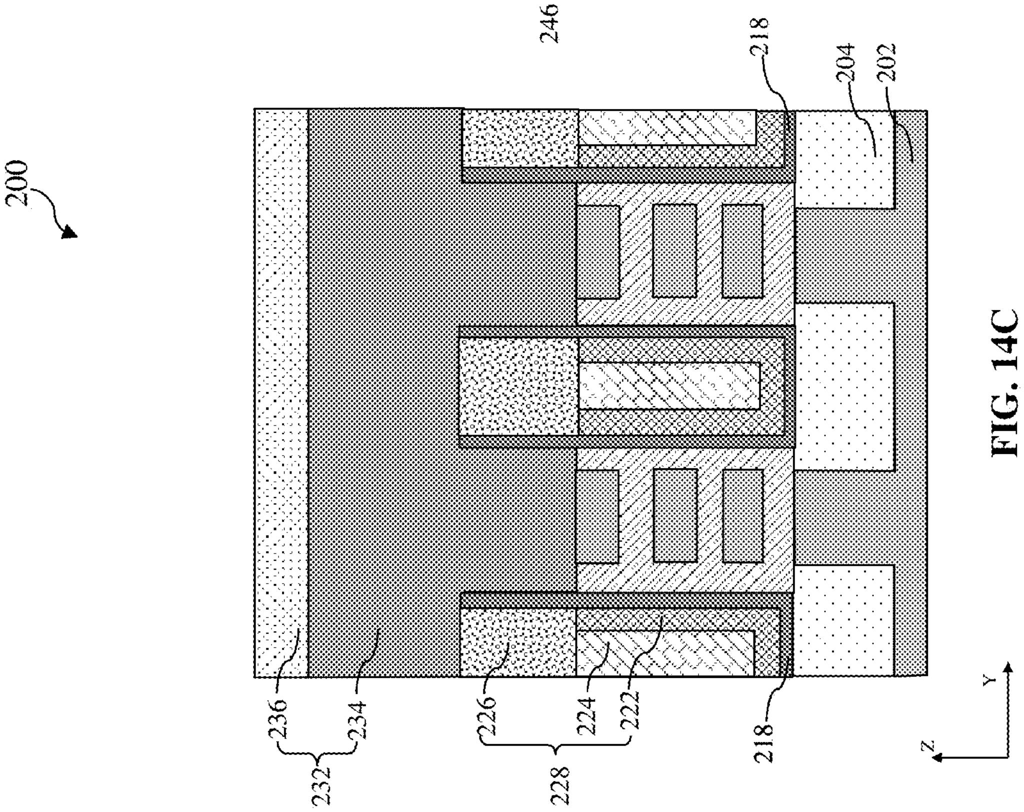

Subsequently, referring to FIGS. 14A-14D, inner spacers 244 are formed to fill in the gaps between the adjacent semiconductor layers 210A. The inner spacers 244 comprise a dielectric material, such as SiN, SiCN, SiON, SiOCN, or combinations thereof. The dielectric material of the inner spacers may be deposited in the S/D trenches 240 and in the gaps 242 between the edges of the semiconductor layers 210A by ALD, CVD, PVD, or combinations thereof. Extra dielectric material is then removed along sidewalls of the gate spacers 238 until the sidewalls of the semiconductor layers 210A are exposed in the S/D trenches 240. In some embodiments, the inner spacers 244 has the width W3 (for example, about 3 nm to about 10 nm) in the X-direction. Referring to FIGS. 14B and 14D, the gate spacer 238 and the inner spacer 244 form a spacer structure 246 wrapping the edge portions of the semiconductor layers 210A.

Figure 15B:
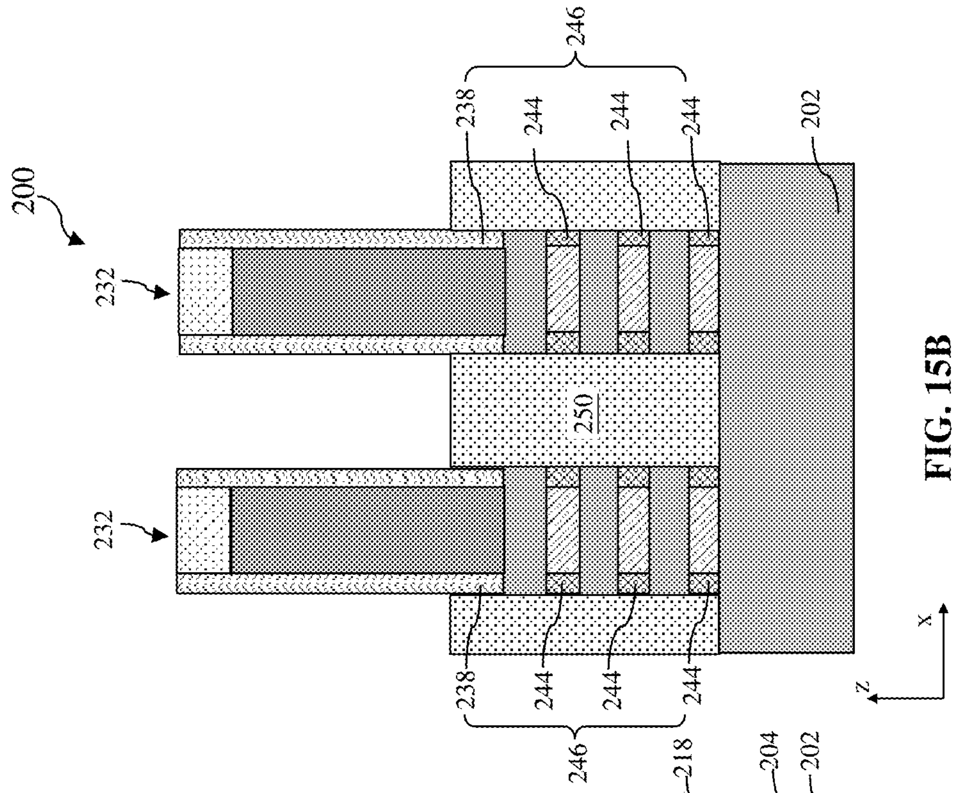
Figure 15A:
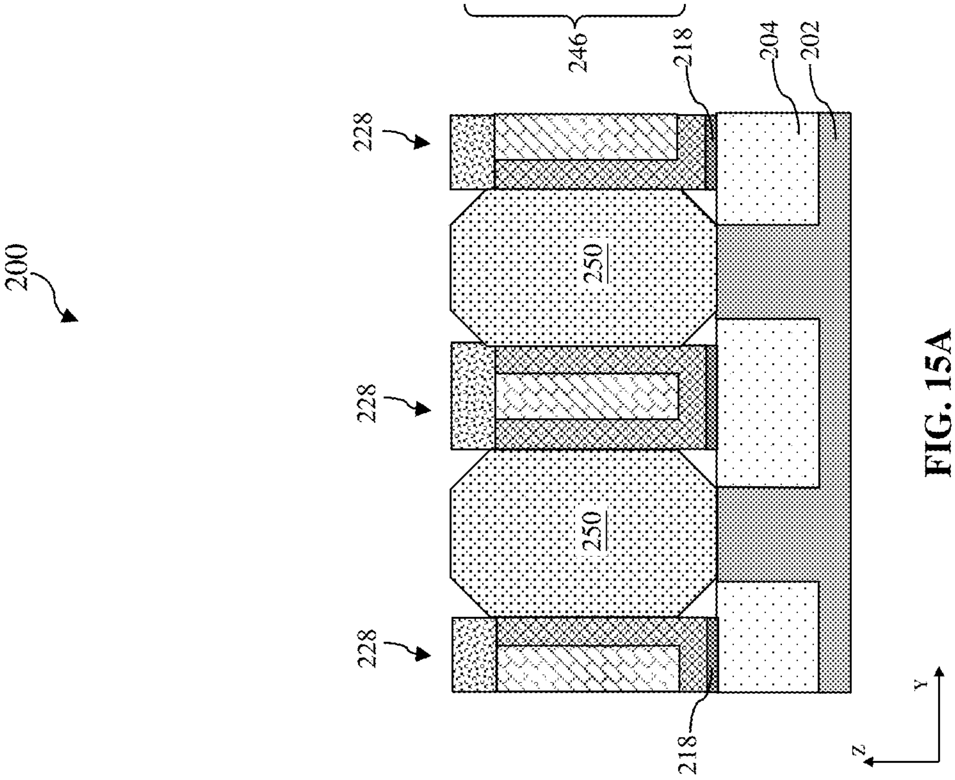
Figure 15D:
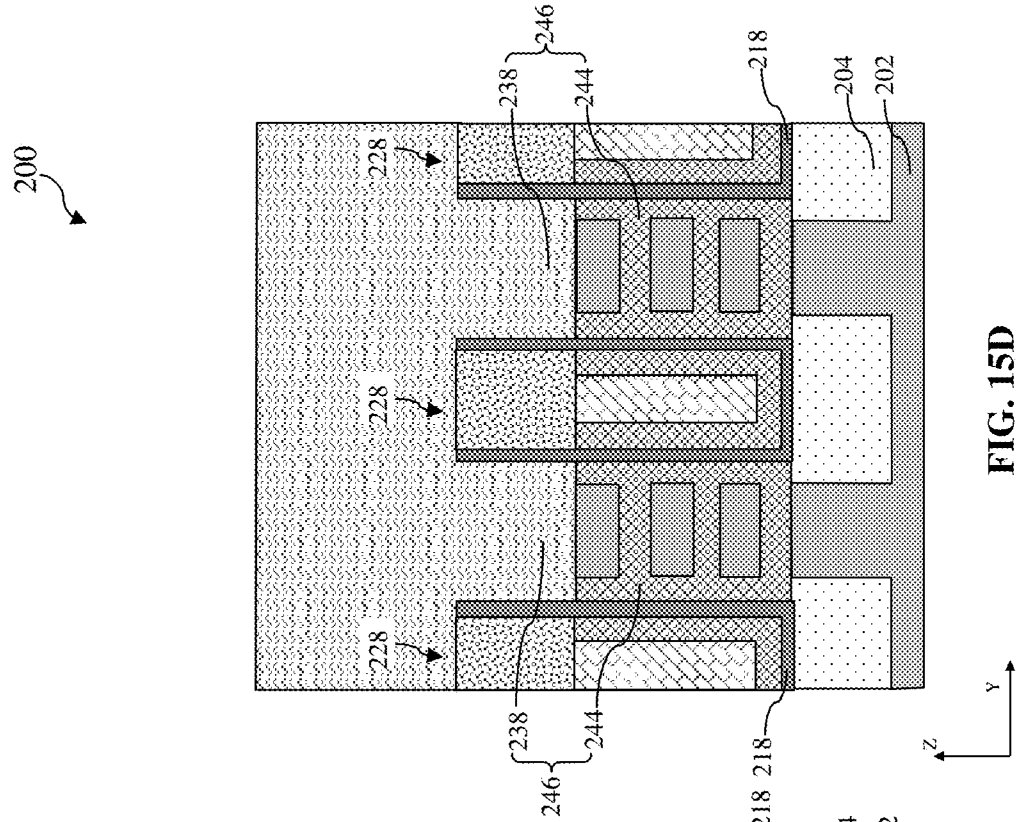
Figure 15C:
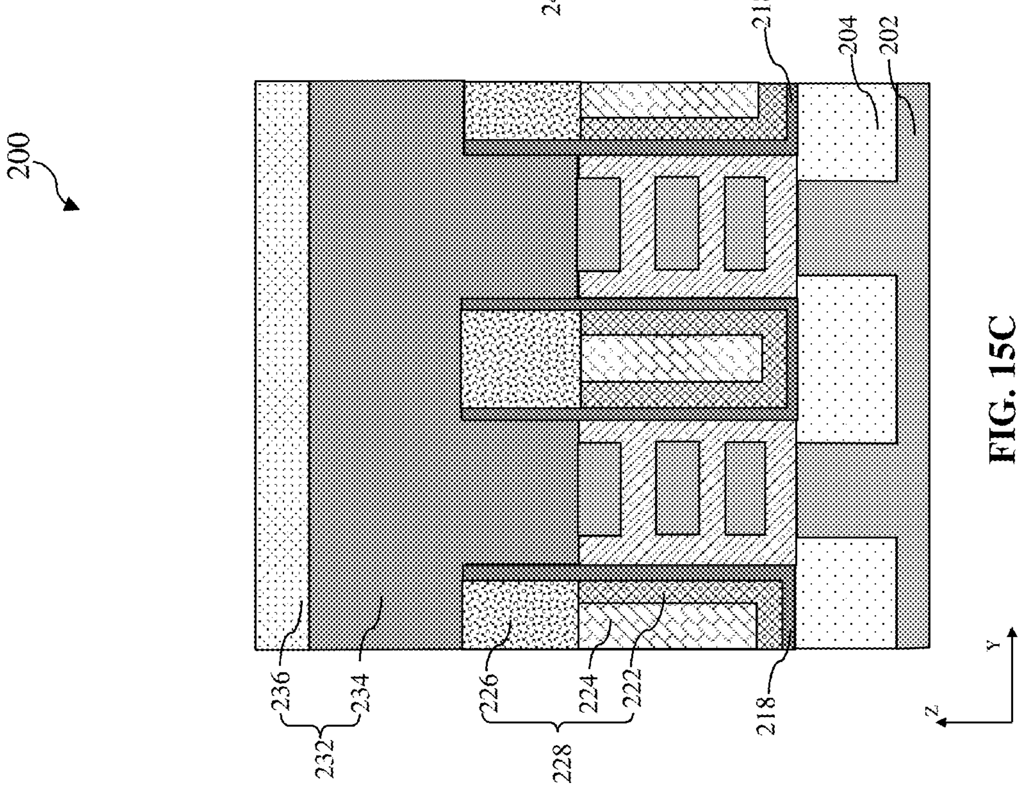

Referring to FIGS. 1 and 15A-15D, at operation 118, epitaxial S/D features 250 are formed in the S/D trenches 240. In some embodiments, the epitaxial S/D features 250 may comprise a semiconductor material such as silicon (Si) or germanium (Ge); a compound semiconductor such as silicon germanium (SiGe), silicon carbide (SiC), gallium arsenide (GaAs), etc.; an alloy semiconductor; or combinations thereof. An epitaxy process may be implemented to epitaxially grow S/D features 250. The epitaxy process may comprise a CVD (for example, VPE, UHV-CVD, LPCVD, MOCVD, and/or PECVD) process, a MBE process, other suitable selective epitaxial growth (SEG) processes, or combinations thereof. Epitaxial S/D features 250 may be doped with n-type dopants and/or p-type dopants. In some embodiments, epitaxial S/D features 250 may comprise multiple epitaxial semiconductor layers, and different epitaxial semiconductor layers are different in amount of dopant comprised therein. Referring to FIG. 15A, in some embodiments, a top surface of the epitaxial S/D features 250 is substantially co-planar with or below a top surface of the dummy fin structure 228.

Figure 16B:
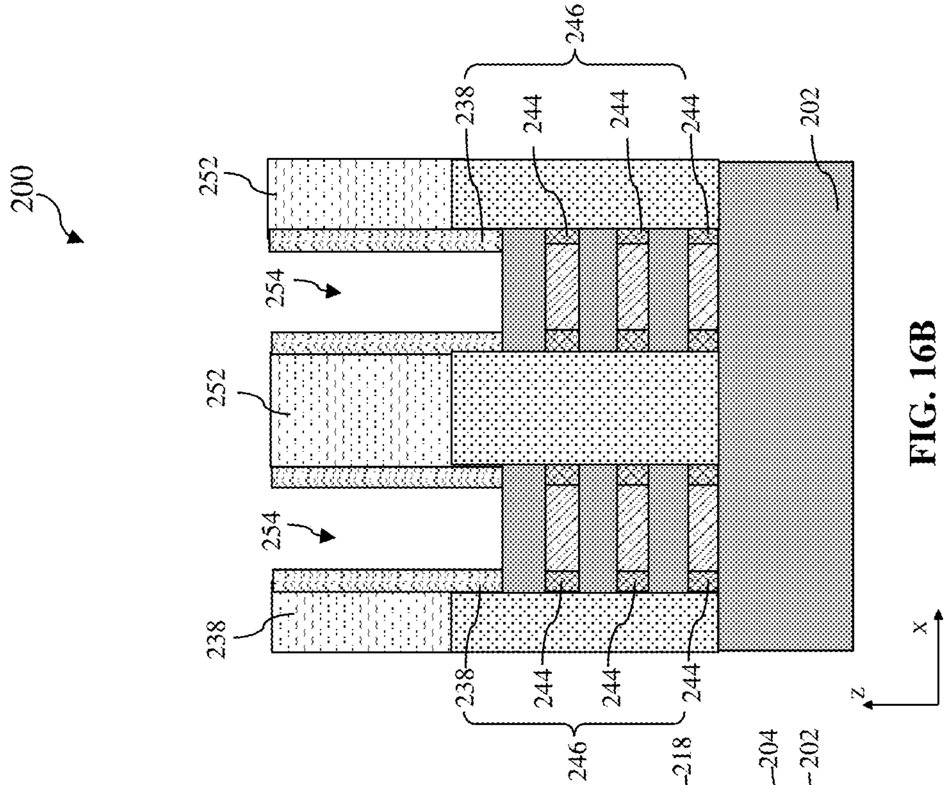
Figure 16A:
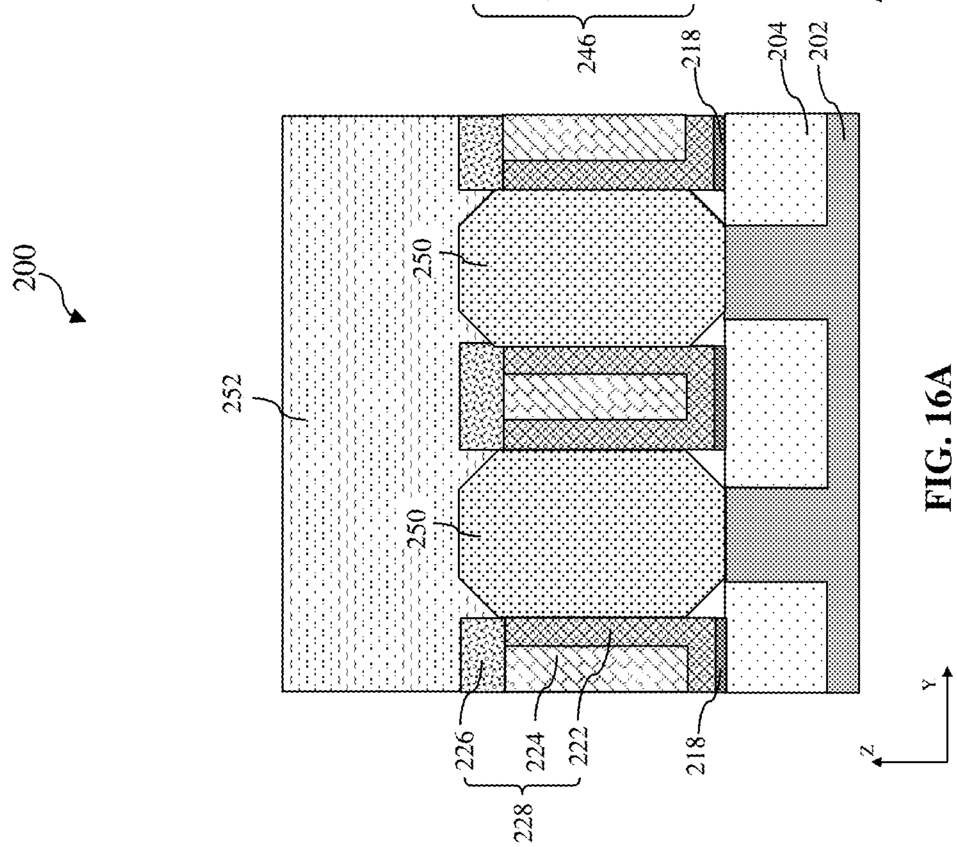
Figure 16D:
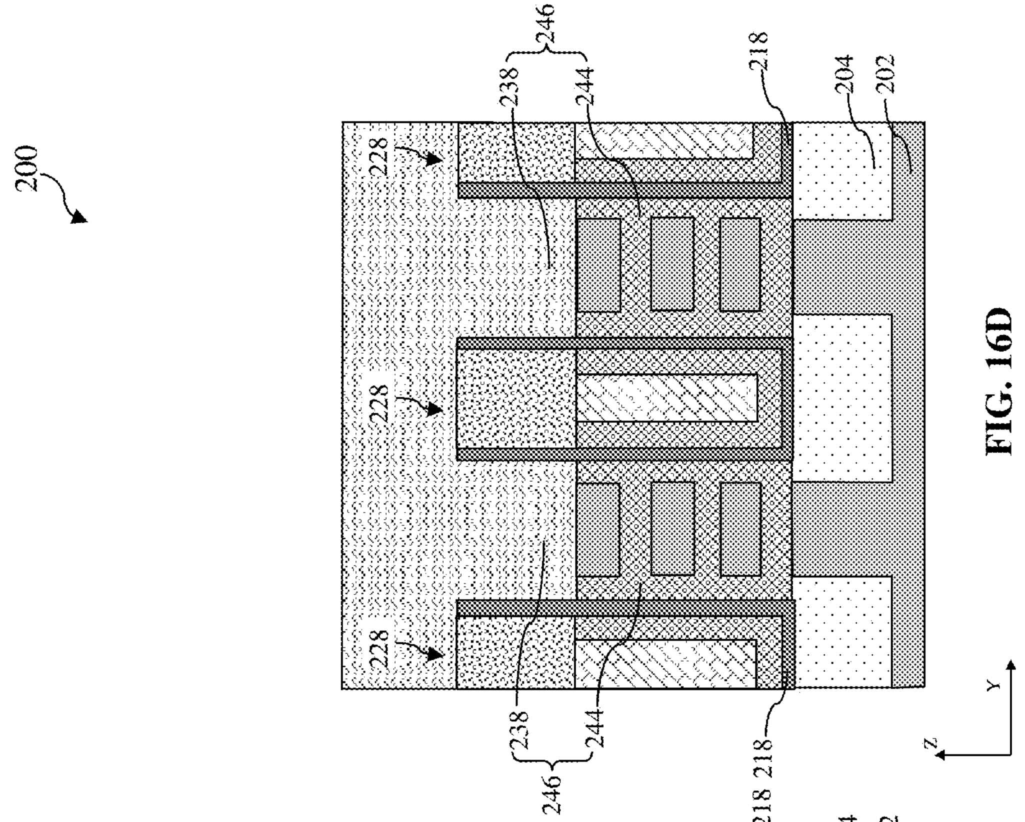
Figure 16C:
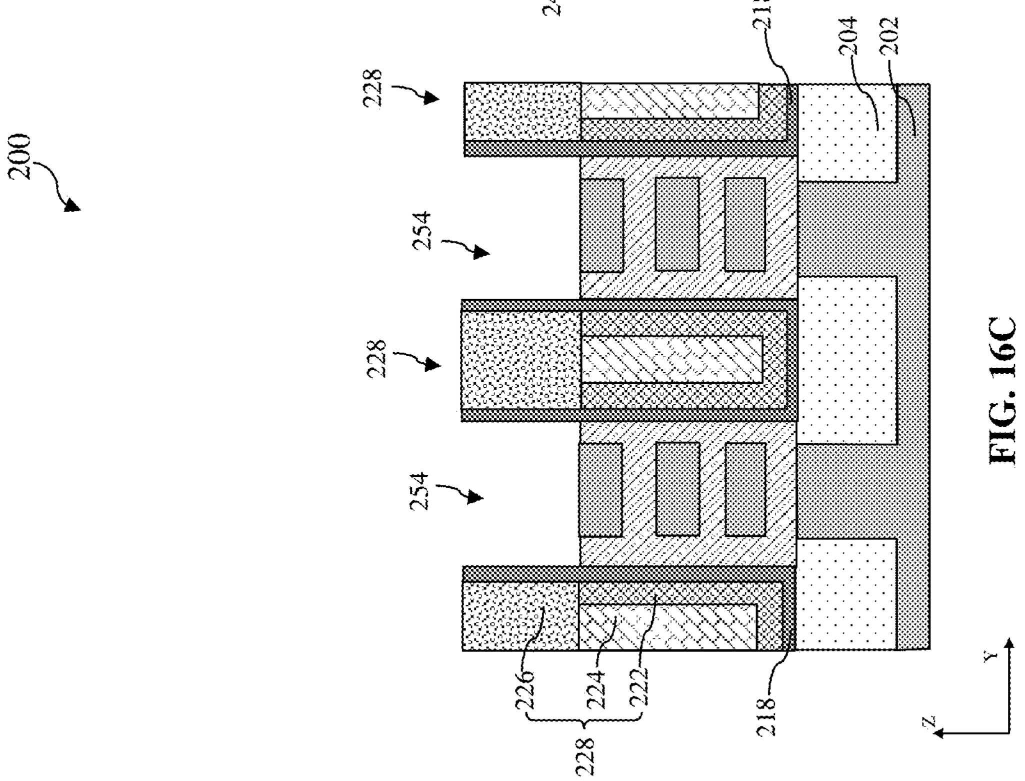

Referring to FIGS. 1, 16A-16D to 19A-19D, at operation 120, a metal gate replacement process is performed to replace the dummy gate structures 232 with metal gate structures 260. The metal gate replacement process includes various processing steps. Referring to FIGS. 16A-16D, an interlayer dielectric (ILD) layer 252 is formed over the substrate 202. In some embodiments, the ILD layer 252 comprises a low-k (k≤3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 252 may comprise a multilayer structure having multiple dielectric materials and may be formed by a deposition process such as CVD (for example, flowable CVD (FCVD)), spin-on-glass (SOG), other suitable methods, or combinations thereof. In some embodiments, an etch stop layer (ESL, not shown) including dielectric material(s) (such as SiN, SiON, SiCN, SiOCN, and/or other dielectric material) may be deposited before the ILD layer 252 is deposited. A planarization process (such as CMP) may be performed to remove the top surface of the device 200, including the hard mask 236 of the dummy gate structures 232. Thereafter, the remained portions of the dummy gate structures 232 are removed to form gate trenches 254 exposing the channel regions of the stacks 210. Referring to FIG. 16C, the gate trenches 254 expose the semiconductor stacks 210, the cladding layers 216, and the liners 218. In some embodiments, removing the dummy gate structures 232 comprises one or more etching processes, such as wet etching, dry etching (for example, reactive-ion etching (RIE)), or combinations thereof.

Figure 17B:
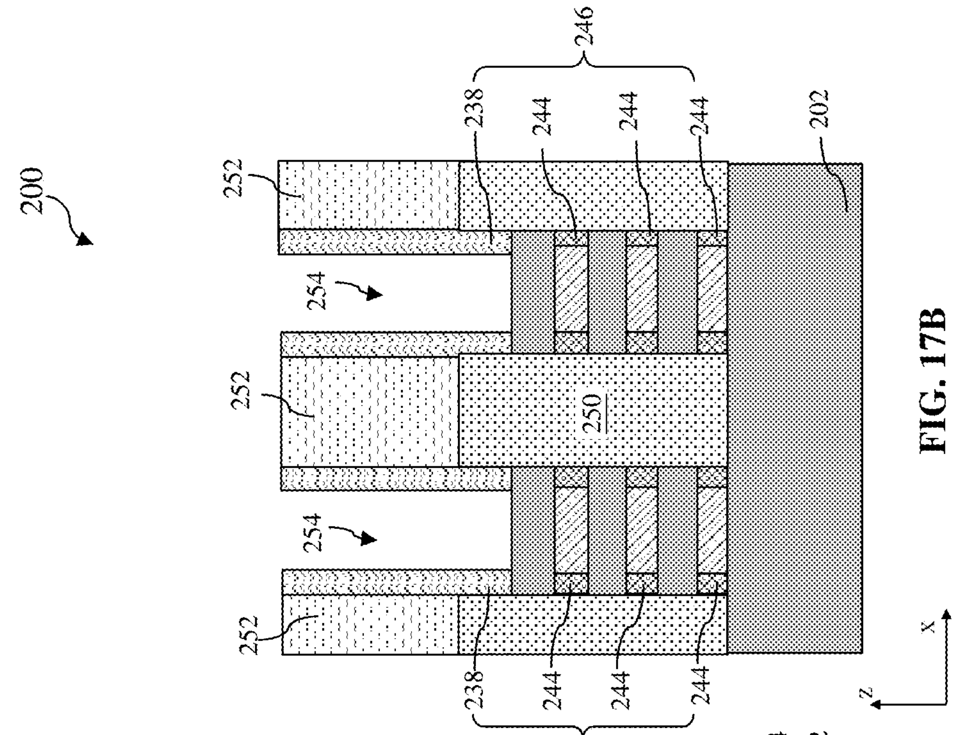
Figure 17A:
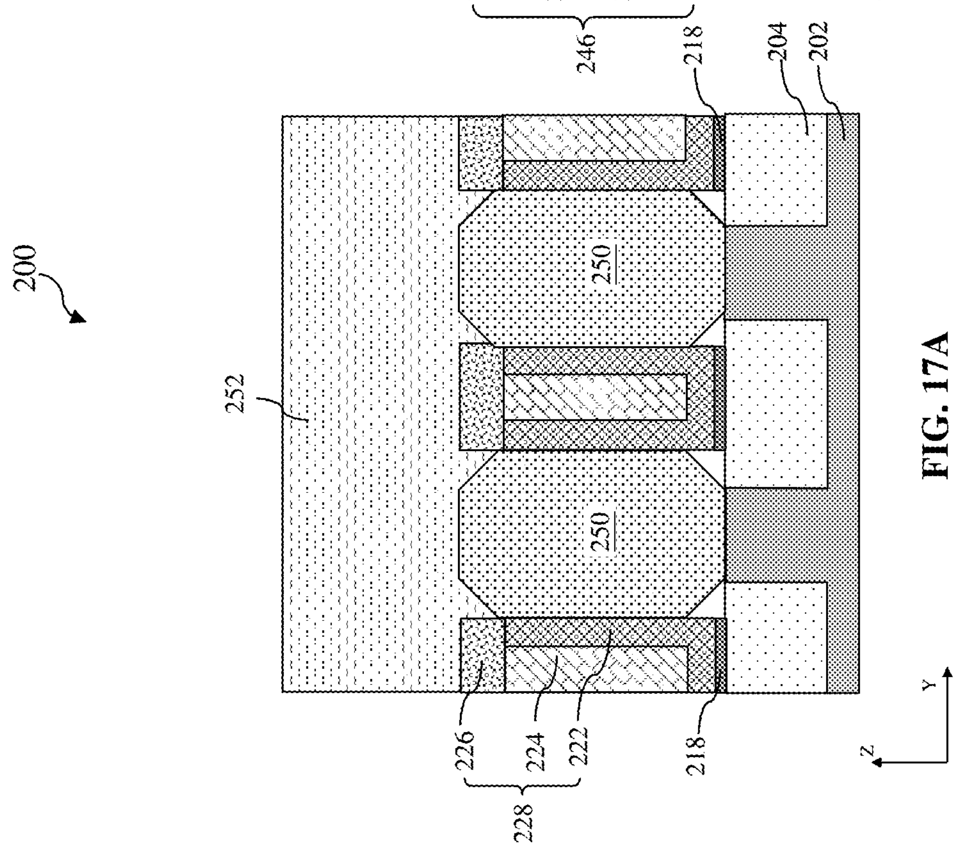
Figure 17D:
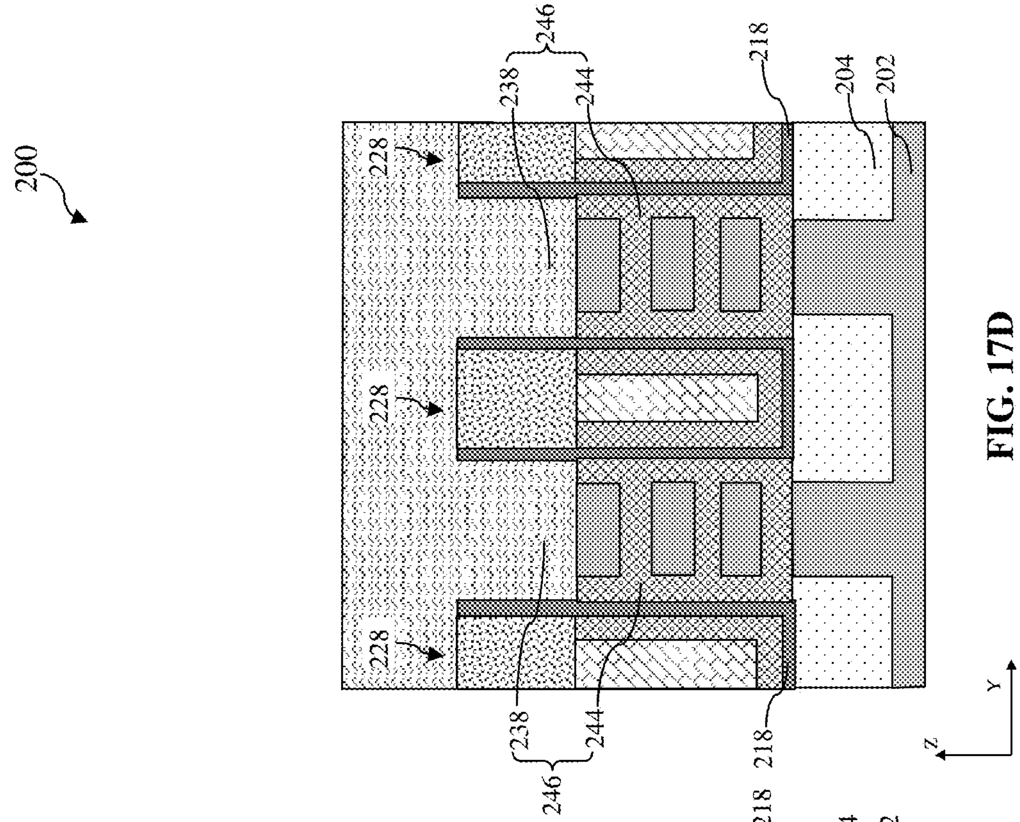
Figure 17C:
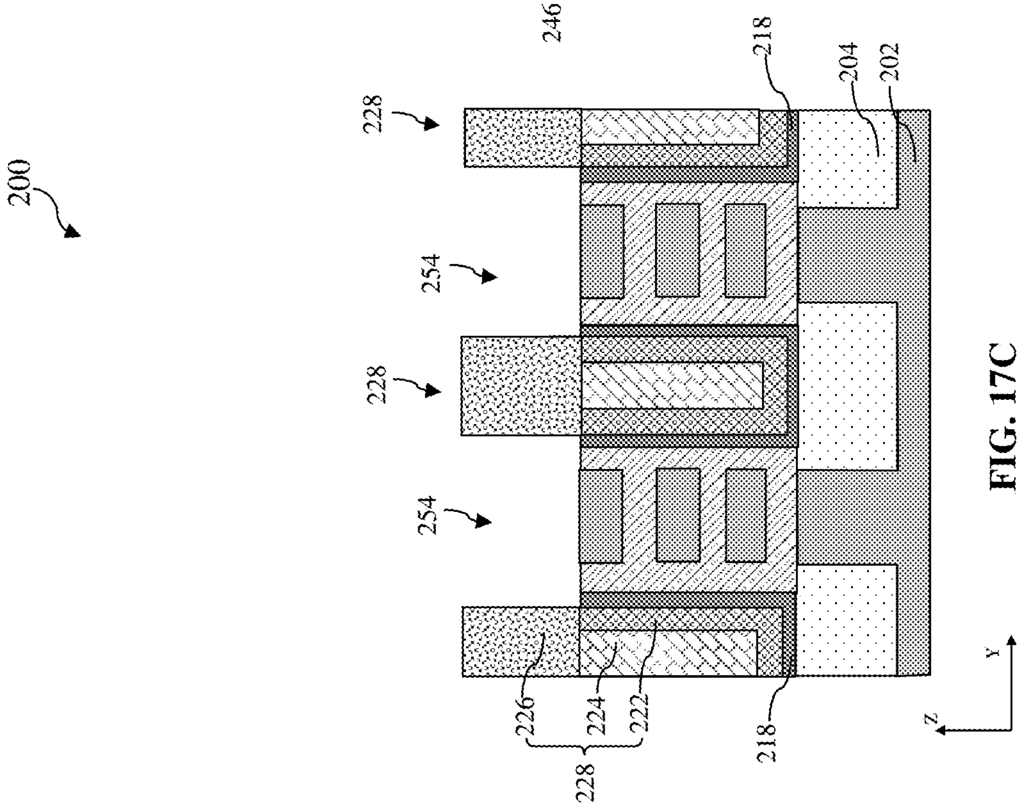

Then, referring to FIGS. 17A-17D, portions of the liners 218 exposed in the gate trenches 254 are removed. Referring to FIG. 17C, the exposed portions of the liners 218 are removed by a dry etching process. The etching process may be a selective process, since the material of the liner 218 is different from that of the dummy feature 226 of the dummy fin structure 228. Referring to FIG. 17D, the liners 218 between the spacer structure 246 (including the gate spacer 238 and the inner spacer 244) and the dummy fin structures 228, are substantially unchanged.

Figure 18B:
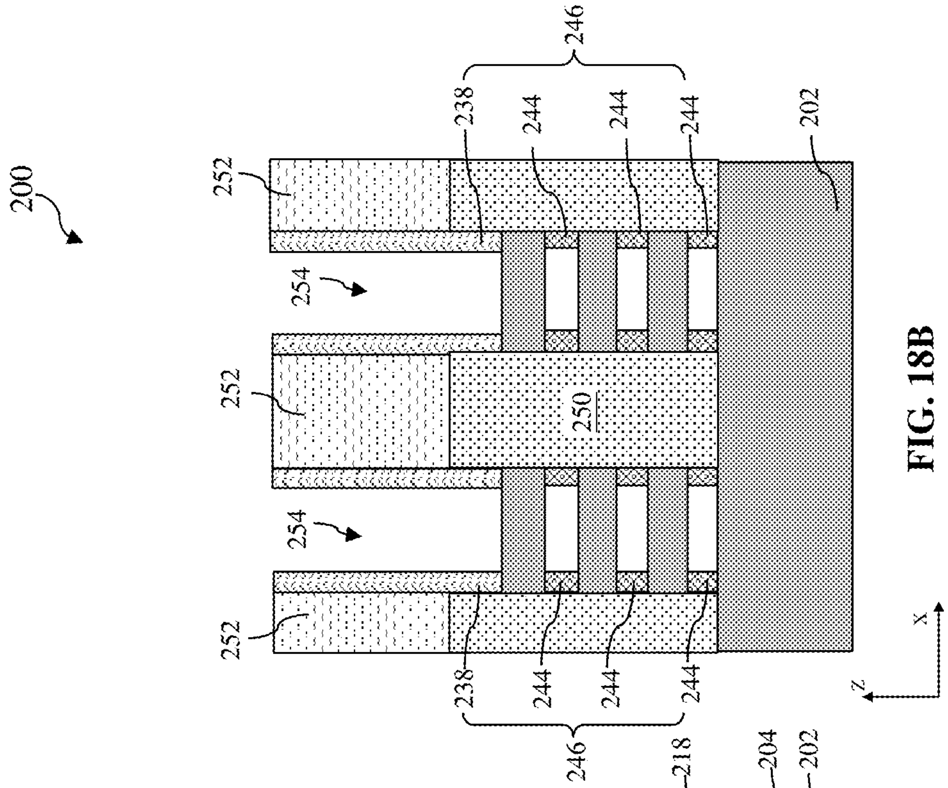
Figure 18A:
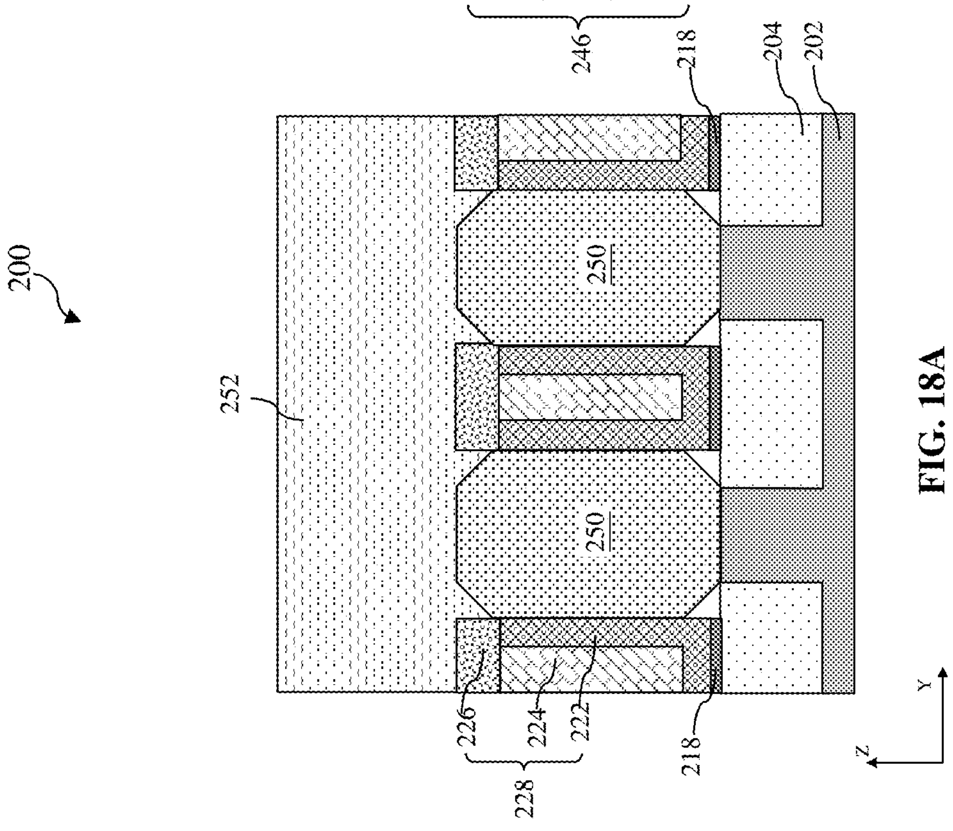
Figure 18D:
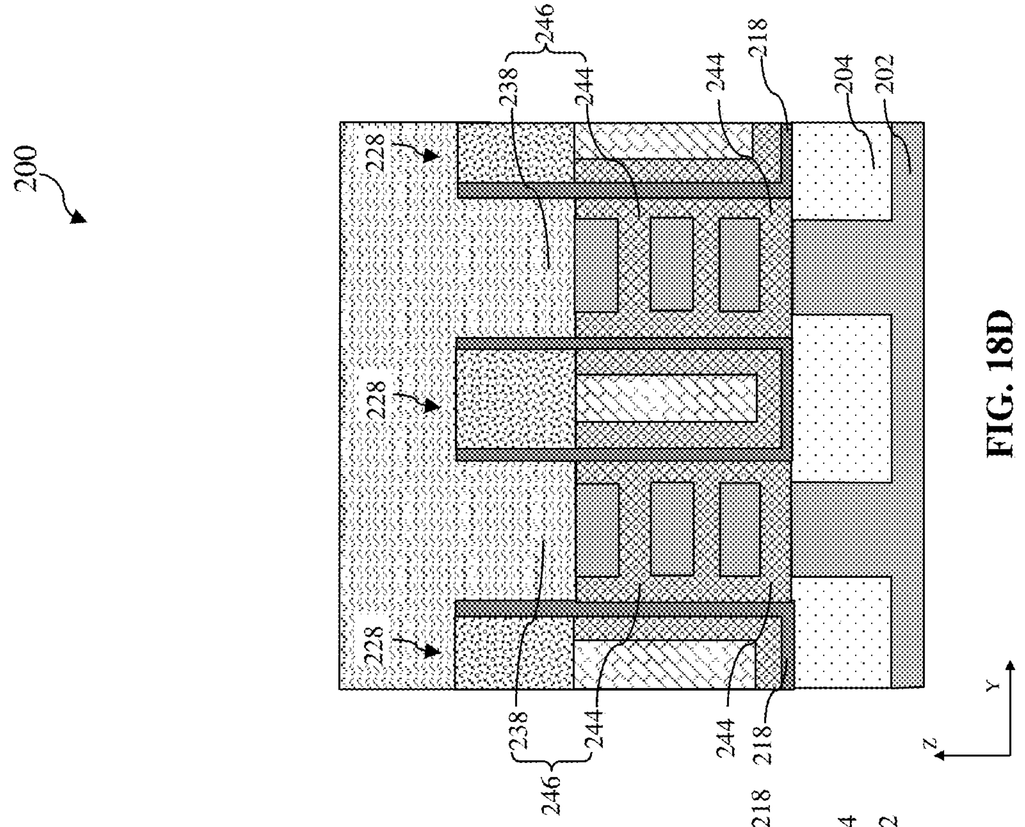
Figure 18C:
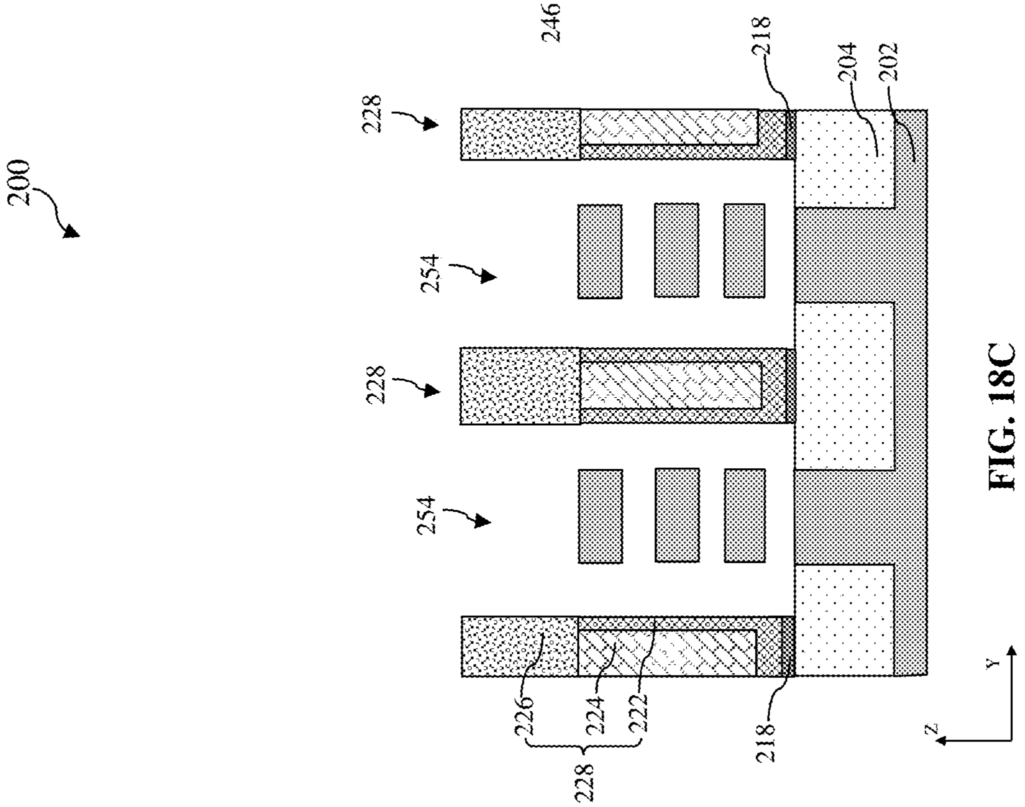

Thereafter, referring to FIGS. 18A-18D, a channel release process is performed, such that the semiconductor layers 210B and the cladding layer 216 are removed from the gate trenches 254. As a result, the semiconductor layers 210A are suspended in the channel region. The suspended semiconductor layers 210A are also referred to as channel semiconductor layers 210A. The semiconductor layers 210B and the cladding layer 216 are removed by a selective etching process that is tuned to remove only the semiconductor layers 210B and the cladding layer 216 (for example, both include SiGe) while the semiconductor layers 210A (for example, includes Si) remain substantially unchanged. The selective etching may be a selective wet etching, a selective dry etching, or a combination thereof. In some embodiments, the selective wet etching process may comprise a hydro fluoride (HF) or $NH_4OH$ etchant. In some embodiments, the selective removing process may comprise an oxidation process followed by oxidation removal. Referring to FIG. 18C, during the channel release process, the exposed portions of the liners 218 in the Z-direction are also removed by a dry etching process, while the portions of the liners 218 between the dummy fin structures 228 and the isolation feature 204 remain substantially unchanged. In some embodiments, the sidewalls of the dummy fin structures 228 (including the sidewalls of the dummy layer 222 and the dummy feature 226) may also be slightly trimmed during the channel release process due to the non-perfect etching selectivity.

Figure 19B:
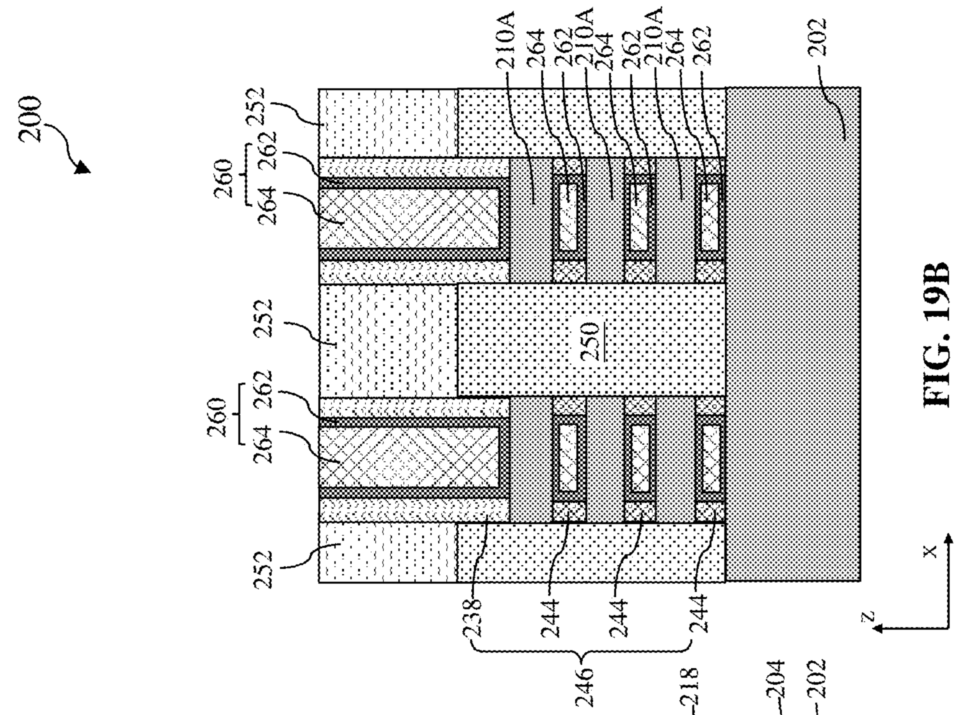
Figure 19A:
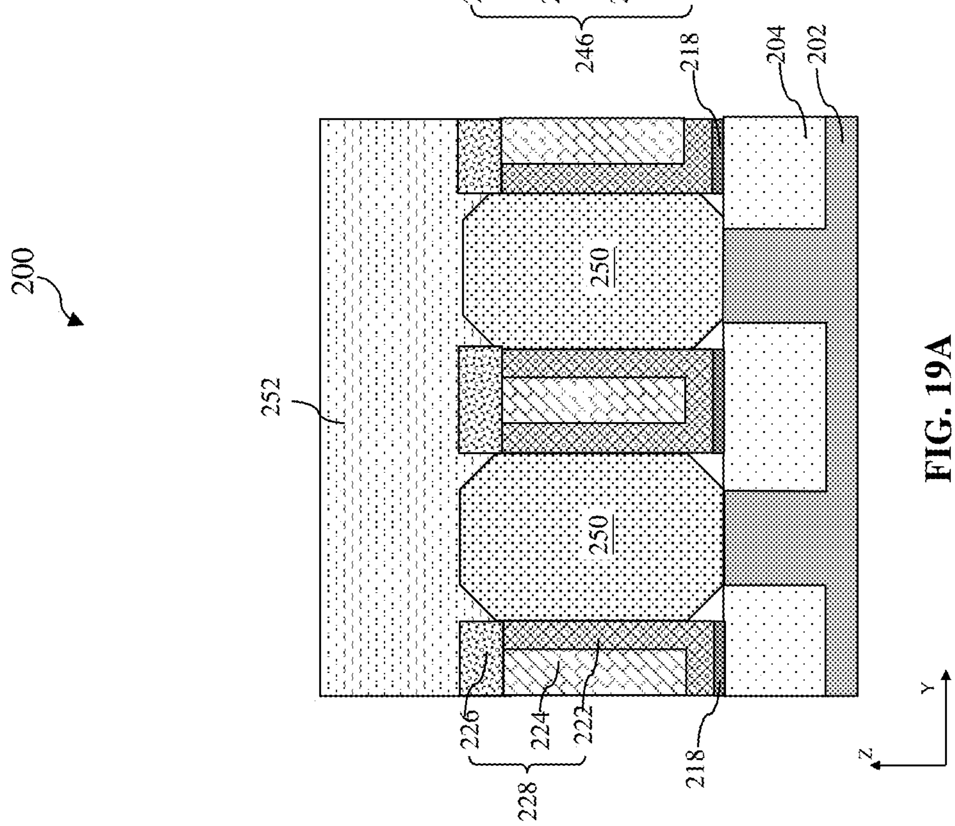

Referring to FIGS. 19A-19D, metal gate structures 260 are formed in the channel regions of the stacks 210. The metal gate structures 260 wrap each of the suspended semiconductor layers 210A. In some embodiments, each metal gate structure 260 may include a gate dielectric layer 262 wrapping around each of the channel semiconductor layers 210A, a metal gate electrode 264 over the gate dielectric layer 262, and other suitable layers (such as a barrier layer, a hard mask layer, etc.). The gate dielectric layer 262 includes a high-k (k>3.9) dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material, or combinations thereof. In some embodiments, the gate dielectric layer 262 is deposited by CVD, PVD, ALD, and/or other suitable method. In some embodiments, each metal gate electrode 264 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The bulk metal may include Al, W, Cu, or combinations thereof. The various layers of the metal gate electrode 264 may be formed by any suitable method, such as CVD, ALD, PVD, plating, chemical oxidation, thermal oxidation, other suitable methods, or combinations thereof. Referring to FIG. 19B, each of the metal gate structure 260 wrap the middle portions of the channel semiconductor layer 210A and each of the spacer structure 246, including the gate spacer 238 and the inner spacer 244, wrap the edge portion of the channel semiconductor layer 210A.

Figure 19D:
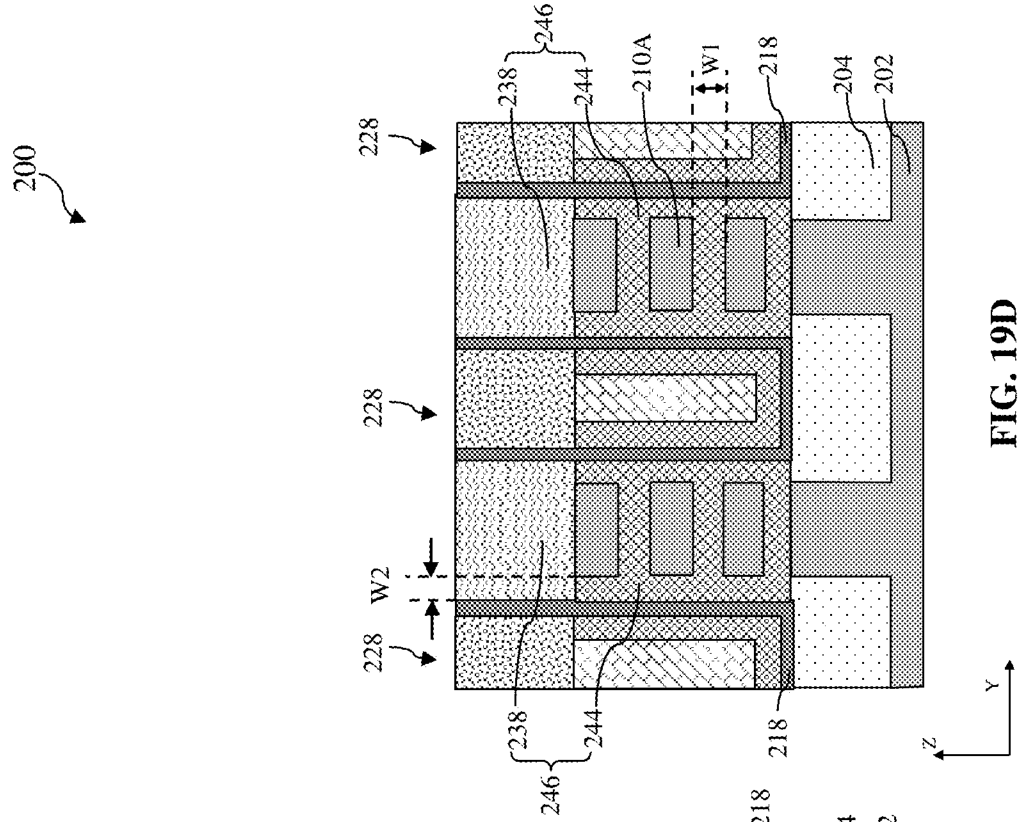
Figure 19C:
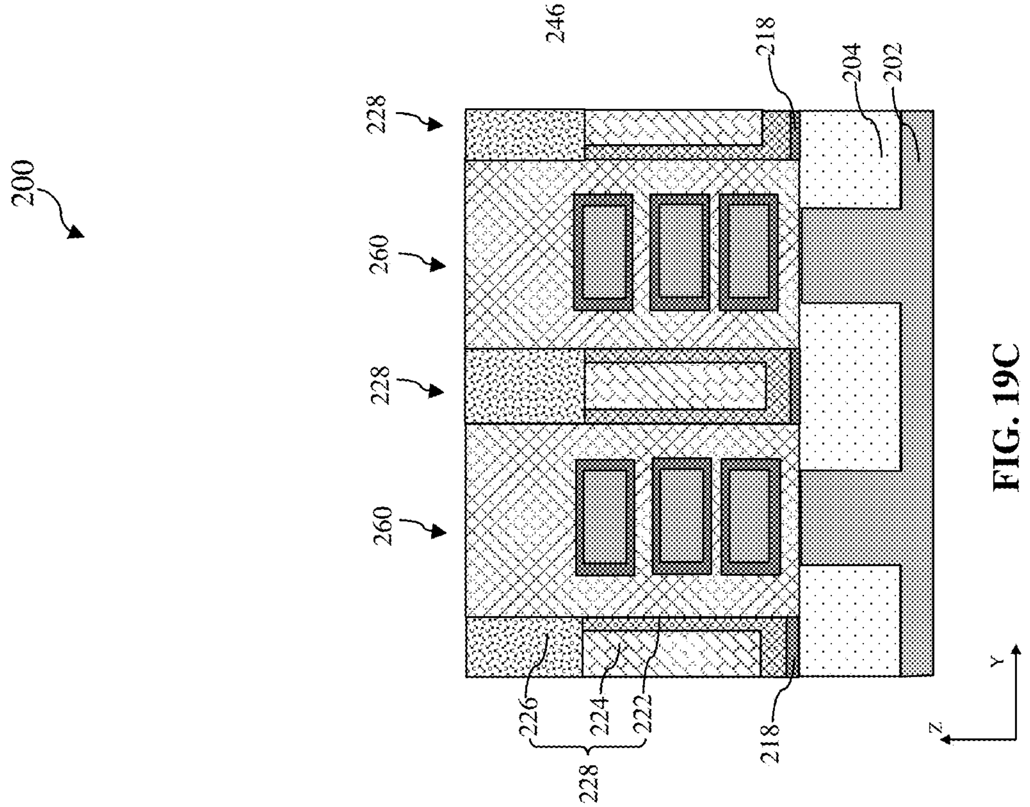
Figure 20B:
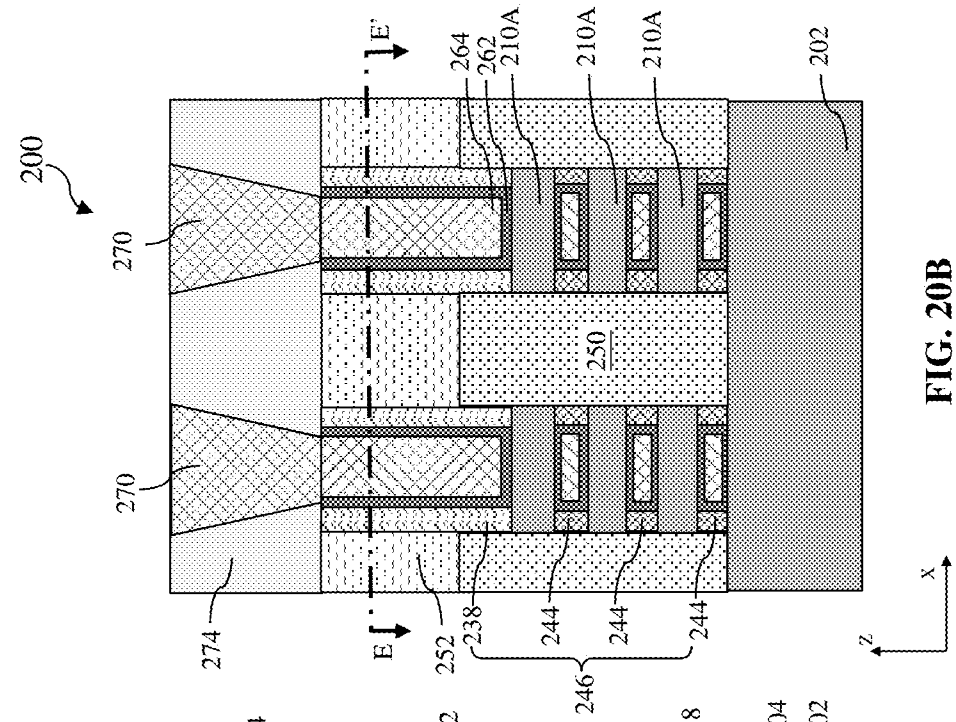
Figure 20A:
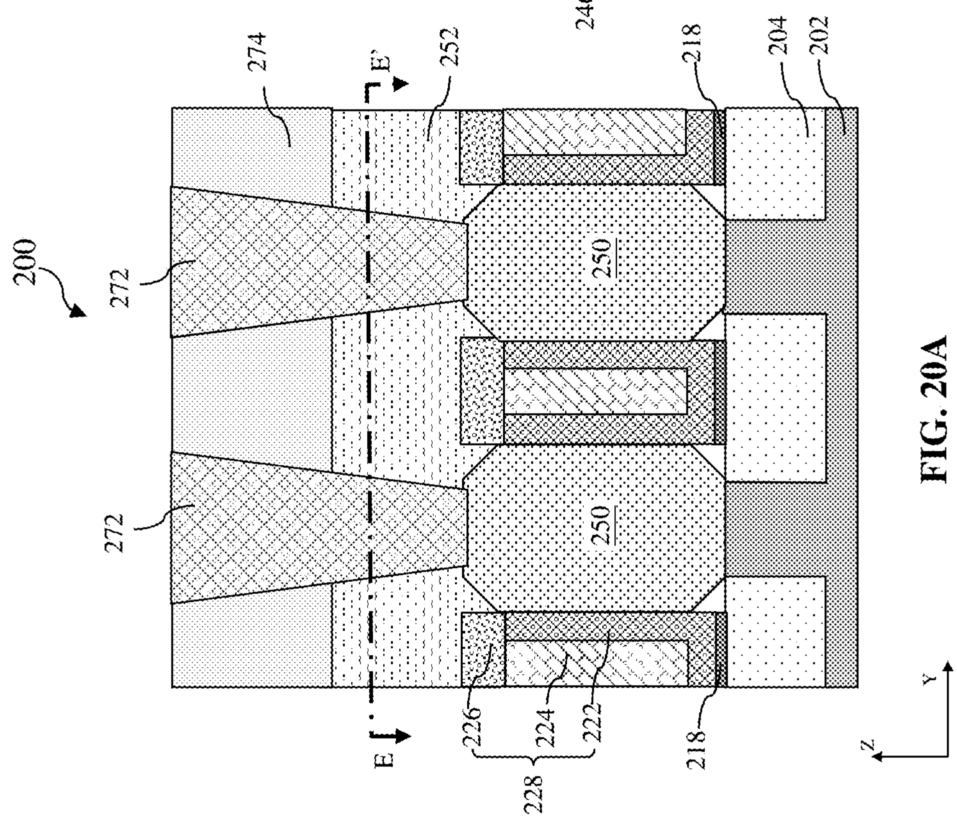
Figure 20D:
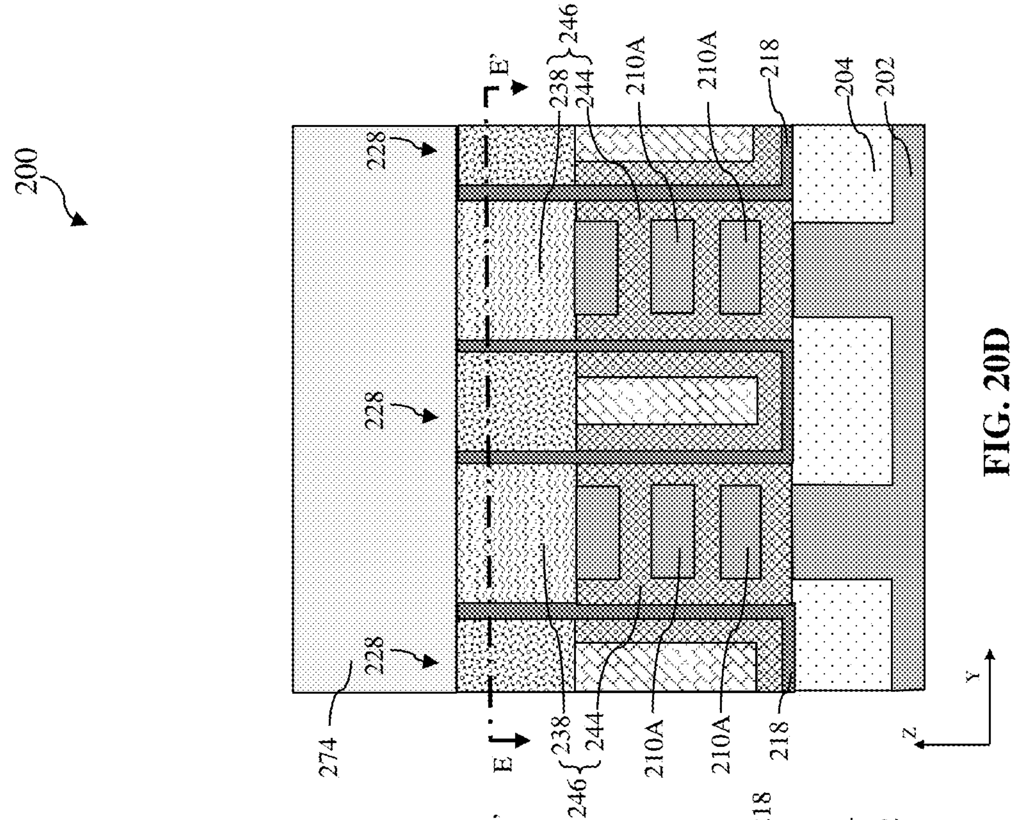
Figure 20C:
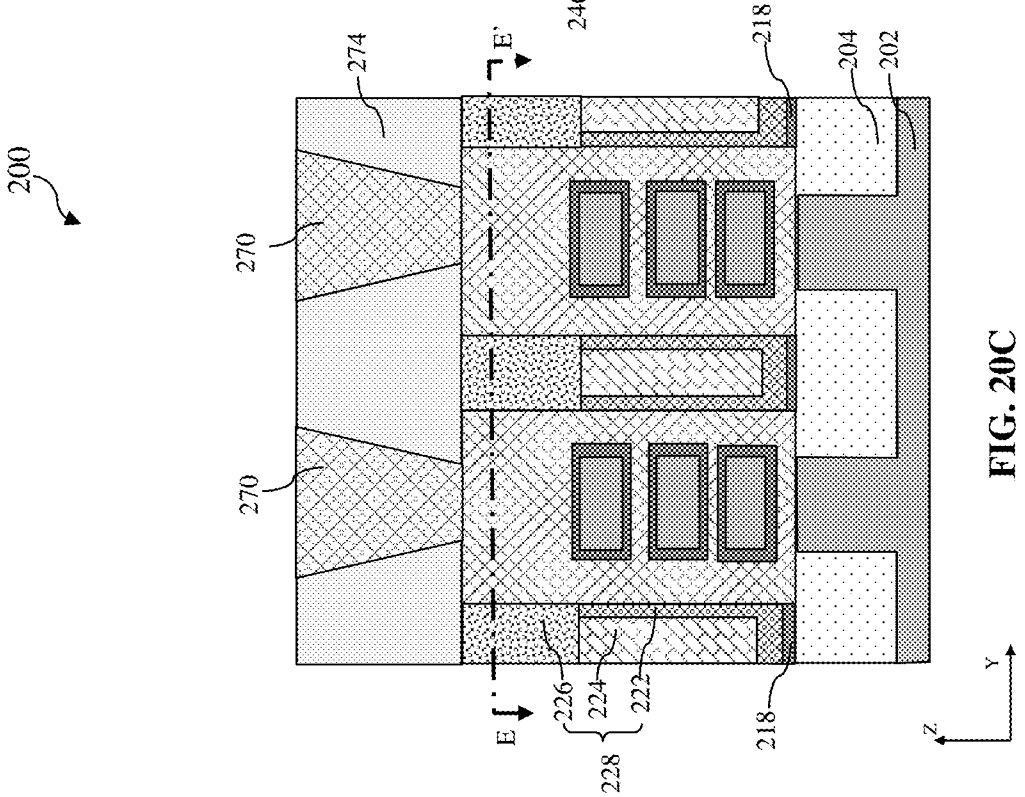

Referring to FIG. 19D, the liners 218 are formed between the dummy fin structures 228 and the spacer structures 246. Specifically, the dummy feature 226 (i.e. the upper portion) of the dummy fin structure 228 is separated from the gate spacer 238 by the liner 218, and the dummy layer 222 (i.e. the lower portion) of the dummy fin structure 228 is separated from the inner spacer 244 by the liner 218. The bottom surface of the dummy feature 226 is substantially co-planar with or below a bottom surface of the gate spacer 238 (i.e. the top surface of the top most semiconductor layer 210A).

Compare with a semiconductor device without the liners 218, the size of the metal gate structure and the size of the end-cap (i.e. the distance between the active region and the dummy fin) in the present disclosure can be enlarged by the liner 218, which can relax the metal gate patterning window and thus mitigate the overlay shifting issue during the metal gate etching process. In addition, without the liners 218 formed between the dummy fin structures 228 and spacer structure 246, a void may occur between the first dummy layer 222 and the inner spacers 244 during the fabrication of the inner spacers, especially if W2 (the thickness of the cladding layer, i.e. the side width of the inner spacers 244) is larger than W1 (the distance between the silicon semiconductor layers 210A, i.e. the sickness of the semiconductor layers 210B). However, the semiconductor device in the present disclosure with the liners 218 formed between the dummy fin structures 228 and the inner spacers 244 can mitigate the void issue therebetween.

Referring to FIGS. 1 and 20A-20D, at operation 122, further processing is performed to complete the fabrication of the device 200. For example, it may form gate contacts 270 and S/D contacts 272, other multilayer interconnect features, such as metal lines, vias, as well as ILD layers 274, and/or etch stop layer over the device 200, configured to connect the various features to form a functional circuit that comprises the different semiconductor devices.

FIG. 21 illustrates a top view of the device 200 in the plane E-E' (i.e. in the X-Y plane) shown in FIGS. 20A-20D. Referring to FIG. 21, the liners 218 existed between the spacer structure (here shows the gate spacer 238) and the dummy fin structure (here shows the dummy feature 226).

Although not intended to be limiting, one or more embodiments of the present disclosure provide many benefits to a semiconductor device and a formation process thereof. For example, embodiments of the present disclosure provide a semiconductor device comprising a dielectric liner formed between a dummy fin structure and an inner spacer. The dielectric liner can enlarge the space between the active regions and the dummy fin structure, thus can relax the metal gate patterning window and mitigate the overlay shifting issue during the metal gate etching process. In addition, the dielectric liner formed between the dummy fin structure and the inner spacer can mitigate the void issues therebetween. Thus, the performance of the semiconductor device can be improved.

The present disclosure provides for many different embodiments. Semiconductor device having dielectric liners and methods of fabrication thereof are disclosed herein. An exemplary semiconductor device comprises semiconductor layers over a substrate, wherein the semiconductor layers are separated from each other and are stacked up along a direction substantially perpendicular to a top surface of the substrate; a gate structure wrapping each of the semiconductor layers; a spacer structure wrapping an edge portion of each of the semiconductor layers; and a dummy fin structure contacting a sidewall of the gate structure, wherein the dummy fin structure is separated from a sidewall of the spacer structure by a dielectric liner In some embodiments, the exemplary semiconductor device further comprises an isolation feature isolating active regions of the semiconductor device, wherein the dielectric liner is disposed between the dummy fin structure and the isolation feature.

In some embodiments, the exemplary semiconductor device further comprises an epitaxial source/drain (S/D) feature contacting a sidewall of the dummy fin structure.

In some embodiments, the dielectric liner includes a dielectric material having silicon and oxygen. In some embodiments, a thickness of the dielectric liner is about 1 nm to about 2 nm. In some embodiments, the gate structure includes a gate dielectric layer wrapping a middle portion of each of the semiconductor layers and a gate electrode over the gate dielectric layer and contacting the dummy fin structure.

In some embodiments, wherein the spacer structure includes a gate spacer over a topmost semiconductor layer and an inner spacer below the gate spacer. In some further embodiments, the dummy fin structure includes a top portion and a bottom portion below the top portion, the top portion of the dummy fin structure is separated from the gate spacer by the dielectric liner and the bottom portion of the dummy fin structure is separated from the inner spacer by the dielectric liner. In some further embodiments, a bottom surface of the top portion of the dummy fin structure is below a top surface of the topmost semiconductor layer. In some further embodiments, the dummy fin structure includes one or more low-k dielectric materials different than the dielectric material of the dielectric liner.

An exemplary method of forming a semiconductor device comprises forming a semiconductor stack including alternate first semiconductor layers and second semiconductor layers over a substrate, wherein the first semiconductor layers and the second semiconductor layers include different materials and are stacked up along a direction generally perpendicular to a top surface of the substrate; conformally depositing a dielectric liner along a sidewall of the semiconductor stack; forming a dummy fin structure along a sidewall of the dielectric liner; forming a dummy gate structure over the semiconductor stack; forming a spacer structure wrapping edge portions of the first semiconductor layers; and replacing the dummy gate structure with a metal gate structure wrapping middle portions of the first semiconductor layers.

In some embodiments, the exemplary method further comprises forming an isolation feature isolating active regions of the semiconductor device, wherein the dielectric liner is conformally deposited between the isolation feature and the dummy fin structure. In some embodiments, the forming the dummy fin structure includes conformally forming a first dummy layer over the dielectric liner to form a dummy trench; depositing a second dummy layer in the dummy trench; recessing the first dummy layer and the second dummy layer below a top surface of a topmost first semiconductor layer; and depositing a third dummy layer over the recessed first dummy layer and the second dummy layer.

In some embodiments, the forming a dummy gate structure includes removing a top portion of the semiconductor stack to expose a top surface of a topmost first semiconductor layer; depositing dummy gate layers over the semiconductor stack, the dielectric liner, and the dummy fin structure; and patterning the dummy gate layers to form the dummy gate structure.

In some embodiments, the forming the spacer structure includes forming a gate spacer along a sidewall of the dummy gate structure, wherein the gate spacer contacts the dielectric liner; etching the semiconductor stack along a sidewall of the gate spacer to form a source/drain (S/D) trench, wherein edge portions of the first semiconductor layers and the second semiconductor layers are exposed in the S/D trench; selectively removing the edge portions of the second semiconductor layers from the S/D trench; and forming an inner spacer to fill in the removed edge portions of the second semiconductor layers, wherein the inner spacer contacting the dielectric liner.

In some embodiments, the exemplary method further comprises removing a portion of the dielectric liner exposed in the S/D trench; and epitaxially growing a S/D feature in the S/D trench.

Another exemplary method comprises forming a semiconductor stack including alternate first semiconductor layers and second semiconductor layers over a substrate, wherein the first semiconductor layers and the second semiconductor layers include different materials and are stacked up along a direction generally perpendicular to a top surface of the substrate; depositing a third semiconductor layer around the semiconductor stack, wherein the third semiconductor layer includes the same material as the second semiconductor layers; conformally depositing a dielectric liner along a sidewall of the third semiconductor layer; forming a dummy fin structure along the dielectric liner; forming a dummy gate structure over the semiconductor stack; forming a gate spacer along a sidewall of the dummy gate structure; forming an inner spacer between edge portions of the first semiconductor layers; removing the dummy gate structure to form a gate trench; selectively removing the second semiconductor layers, the third semiconductor layer, and a portion of the dielectric liner exposed in the gate trench; and forming a metal gate structure wrapping middle portions of the first semiconductor layers exposed in the gate trench.

In some embodiments, the forming the inner spacer includes etching the semiconductor stack along a sidewall of the gate spacer to form a source/drain (S/D) trench, wherein edge portions of the first semiconductor layers, the second semiconductor layers, and the third semiconductor layers are exposed in the S/D trench; selectively removing the edge portions of the second semiconductor layers and the third semiconductor layers from the S/D trench; depositing an inner spacer layer in the S/D trench; and removing a portion of the inner spacer layer along the gate spacer until the edge portions of the first semiconductor layers are exposed in the S/D trench.

In some embodiments, the exemplary method further comprises removing a portion of the dielectric liner along the dummy fin structure exposed in the S/D trench; and epitaxially growing an S/D feature from the substrate in the S/D trench, wherein a top surface of the S/D feature is below a top surface of the dummy fin structure.

In some embodiments, the dielectric liner is conformally deposited for a thickness of about 1 nm to about 2 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

semiconductor layers over a substrate, wherein the semiconductor layers are separated from each other and are stacked up along a direction substantially perpendicular to a top surface of the substrate;

a gate structure wrapping each of the semiconductor layers;

a spacer structure wrapping an edge portion of each of the semiconductor layers; and a dummy fin structure contacting a sidewall of the gate structure, wherein the dummy fin structure is separated from a sidewall of the spacer structure by a dielectric liner.

2. The semiconductor device of claim 1, further comprising an isolation feature isolating active regions of the semiconductor device, wherein the dielectric liner is disposed between the dummy fin structure and the isolation feature.

3. The semiconductor device of claim 1, wherein the dielectric liner includes a dielectric material having silicon and oxygen.

4. The semiconductor device of claim 1, wherein a thickness of the dielectric liner is about 1 nm to about 2 nm.

5. The semiconductor device of claim 1, further comprising an epitaxial source/drain (S/D) feature contacting a sidewall of the dummy fin structure.

6. The semiconductor device of claim 1, wherein the gate structure includes a gate dielectric layer wrapping a middle portion of each of the semiconductor layers and a gate electrode over the gate dielectric layer and contacting the dummy fin structure.

7. The semiconductor device of claim 1, wherein the spacer structure includes a gate spacer over a topmost semiconductor layer and an inner spacer below the gate spacer.

8. The semiconductor device of claim 7, wherein the dummy fin structure includes a top portion and a bottom portion below the top portion, the top portion of the dummy fin structure is separated from the gate spacer by the dielectric liner and the bottom portion of the dummy fin structure is separated from the inner spacer by the dielectric liner.

9. The semiconductor device of claim 8, wherein a bottom surface of the top portion of the dummy fin structure is below a top surface of the topmost semiconductor layer.

10. The semiconductor device of claim 8, wherein the dummy fin structure includes one or more low-k dielectric materials different than the dielectric material of the dielectric liner.

11. A method of forming a semiconductor device, comprising:

forming a semiconductor stack including alternate first semiconductor layers and second semiconductor layers over a substrate, wherein the first semiconductor layers and the second semiconductor layers include different materials and are stacked up along a direction generally perpendicular to a top surface of the substrate;

conformally depositing a dielectric liner along a sidewall of the semiconductor stack;

forming a dummy fin structure along a sidewall of the dielectric liner;

forming a dummy gate structure over the semiconductor stack;

forming a spacer structure wrapping edge portions of the first semiconductor layers; and replacing the dummy gate structure with a metal gate structure wrapping middle portions of the first semiconductor layers.

12. The method of claim 11, further comprising forming an isolation feature isolating active regions of the semiconductor device, wherein the dielectric liner is conformally deposited between the isolation feature and the dummy fin structure.

13. The method of claim 12, wherein the forming the dummy fin structure includes:

conformally forming a first dummy layer over the dielectric liner to form a dummy trench;

depositing a second dummy layer in the dummy trench;

recessing the first dummy layer and the second dummy layer below a top surface of a topmost first semiconductor layer; and depositing a third dummy layer over the recessed first dummy layer and the second dummy layer.

14. The method of claim 11, wherein the forming a dummy gate structure includes:

removing a top portion of the semiconductor stack to expose a top surface of a topmost first semiconductor layer;

depositing dummy gate layers over the semiconductor stack, the dielectric liner, and the dummy fin structure; and patterning the dummy gate layers to form the dummy gate structure.

15. The method of claim 11, wherein the forming the spacer structure includes:

forming a gate spacer along a sidewall of the dummy gate structure, wherein the gate spacer contacts the dielectric liner;

etching the semiconductor stack along a sidewall of the gate spacer to form a source/drain (S/D) trench, wherein edge portions of the first semiconductor layers and the second semiconductor layers are exposed in the S/D trench;

selectively removing the edge portions of the second semiconductor layers from the S/D trench; and forming an inner spacer to fill in the removed edge portions of the second semiconductor layers, wherein the inner spacer contacting the dielectric liner.

16. The method of claim 15, further comprising:

removing a portion of the dielectric liner exposed in the S/D trench; and epitaxially growing a S/D feature in the S/D trench.

17. A method of forming a semiconductor device, comprising:

forming a semiconductor stack including alternate first semiconductor layers and second semiconductor layers over a substrate, wherein the first semiconductor layers and the second semiconductor layers include different materials and are stacked up along a direction generally perpendicular to a top surface of the substrate;

depositing a third semiconductor layer around the semiconductor stack, wherein the third semiconductor layer includes the same material as the second semiconductor layers;

conformally depositing a dielectric liner along a sidewall of the third semiconductor layer;

forming a dummy fin structure along the dielectric liner;

forming a dummy gate structure over the semiconductor stack;

forming a gate spacer along a sidewall of the dummy gate structure;

forming an inner spacer between edge portions of the first semiconductor layers;

removing the dummy gate structure to form a gate trench;

selectively removing the second semiconductor layers, the third semiconductor layer, and a portion of the dielectric liner exposed in the gate trench; and forming a metal gate structure wrapping middle portions of the first semiconductor layers exposed in the gate trench.

18. The method of claim 17, wherein the forming the inner spacer includes:

etching the semiconductor stack along a sidewall of the gate spacer to form a source/drain (S/D) trench, wherein edge portions of the first semiconductor layers, the second semiconductor layers, and the third semiconductor layers are exposed in the S/D trench;

selectively removing the edge portions of the second semiconductor layers and the third semiconductor layers from the S/D trench;

depositing an inner spacer layer in the S/D trench; and removing a portion of the inner spacer layer along the gate spacer until the edge portions of the first semiconductor layers are exposed in the S/D trench.

19. The method of claim 18, further comprising:

removing a portion of the dielectric liner along the dummy fin structure exposed in the S/D trench; and epitaxially growing an S/D feature from the substrate in the S/D trench, wherein a top surface of the S/D feature is below a top surface of the dummy fin structure.

20. The method of claim 17, wherein the dielectric liner is conformally deposited for a thickness of about 1 nm to about 2 nm.

* * * * *